United States Patent
Asai et al.

(10) Patent No.: US 6,884,738 B2
(45) Date of Patent: Apr. 26, 2005

(54) MANUFACTURING METHOD OF SEMICONDUCTOR DEVICE AND SUBSTRATE PROCESSING APPARATUS

(75) Inventors: Masayuki Asai, Tokyo (JP); Kanako Kitayama, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 262 days.

(21) Appl. No.: 10/372,245

(22) Filed: Feb. 25, 2003

(65) Prior Publication Data

US 2003/0181060 A1 Sep. 25, 2003

(30) Foreign Application Priority Data

Mar. 18, 2002 (JP) .......................................... 2002-074495
Dec. 24, 2002 (JP) .......................................... 2002-372915

(51) Int. Cl.[7] .............................................. H01L 21/31
(52) U.S. Cl. ......................................... 438/758; 438/758
(58) Field of Search ................................. 438/758, 791, 438/788, 787, 708, 680, 481, 3; 427/255.25, 255.5, 569, 576

(56) References Cited

U.S. PATENT DOCUMENTS 6,110,531 A * 8/2000 Paz de Araujo et al. ............................................ 427/255.25
6,136,388 A * 10/2000 Raoux et al. ............... 427/569
6,593,247 B1 * 7/2003 Huang et al. ............... 438/758
6,645,884 B1 * 11/2003 Yang et al. ................. 438/791

FOREIGN PATENT DOCUMENTS

| JP | A 9-82696 | 3/1997 |
| JP | B2 2855978 | 11/1998 |
| JP | A 2001-68485 | 3/2001 |

* cited by examiner

Primary Examiner—Evan Pert
Assistant Examiner—Monica D. Harrison
(74) Attorney, Agent, or Firm—Oliff & Berridge, PLC

(57) ABSTRACT

According to the present invention, flatness of a thin film formed on a substrate is improved without generating particles and lowering productivity. A method of manufacturing a semiconductor device includes a first thin film layer forming step A and a second thin film layer forming step B. In the first thin film layer forming step A, on the way of heating and raising the temperature of the substrate up to a film-forming temperature, a film-forming source supply in which an organic source gas is made adhere onto the substrate in yet unreacted state is performed (202), and thereafter, a RPO process (Remote Plasma Oxidation) in which an oxygen radical is supplied onto the substrate to form a first thin film layer is performed (203). In this first thin film layer forming step A, it is preferable to repeat the film-forming source supply onto the substrate and the RPO process more than once. In the second thin film layer forming step B, after the source gas is supplied onto the substrate by a thermal CVD method to perform a film-forming process (205) after raising the temperature of the substrate to the film-forming temperature, the RPO process is performed to form a second thin film layer on the first thin film layer with a predetermined film thickness (206).

20 Claims, 7 Drawing Sheets

○ ··· FILM FORMED AT FIRST TIME
◎ ··· FILM FORMED AT SECOND TIME

MANUFACTURING METHOD OF SEMICONDUCTOR DEVICE AND SUBSTRATE PROCESSING APPARATUS

BACKGROUND OF THE INVENTION

1. Field of the Invention

The present invention relates to a manufacturing method of a semiconductor device and a substrate processing apparatus in which a thin film is formed on a substrate.

2. Description of the Related Art

As one of manufacturing steps of a semiconductor, there is a CVD (Chemical Vapor Deposition) step in which a predetermined film-forming process is preformed on a surface of a substrate (a substrate to be processed based on a silicon wafer, glass, or the like, on which a fine electric circuit pattern is formed). In this step, the substrate is mounted in an airtight reaction chamber and heated by a beater provided in the chamber, and chemical reaction is caused while introducing a source gas to the substrate so as to form a thin film evenly on the fine electric circuit pattern formed on the substrate. In this reaction chamber, a thin film is also formed on components other than the substrate. A CVD apparatus shown in FIG. 10 is provided with a showerhead 6 and a susceptor 2 in the reaction chamber 1, and the substrate 4 is mounted on the susceptor 2. The source gas is introduced into the reaction chamber 1 through a source gas supply pipe 5 connected to the showerhead 6 and supplied onto the substrate 4 via many holes 8 provided on the showerhead 6. The gas supplied to the substrate 4 is exhausted through an exhaust pipe 7. Incidentally, the substrate 4 is heated by a heater 3 provided under the susceptor 2.

As such a CVD apparatus, there exists a CVD apparatus in use of a MOCVD (Metal Organic Chemical Vapor Deposition) method in which an amorphous $HfO_2$ film and an amorphous Hf silicate film can be formed by using an organic chemical material as a film-forming source.

For the film-forming source, $Hf[OC(CH_3)_3]_4$ (It is referred to as $Hf\text{-}(OtBu)_4$ below), $Hf[OC(CH_3)_2CH_2OCH_3]_4$ (It is referred to as $Hf\text{-}(MMP)_4$ below. Note that MMP indicates 1 methoxy-2-methyl-2-propoxy), $Hf[O\text{---}Si\text{---}(CH_3)_3]_4$ (It is referred to as $Hf\text{-}(OSi)_4$), and the like are used.

In these chemicals, many organic materials, for example, such as $Hf\text{-}(OtBu)_4$ and $Hf\text{-}(MMP)_4$, are in liquid phase at normal temperatures and pressures. Therefore, $Hf\text{-}(MMP)_4$, for example, is utilized after changed into gas at vapor pressure by heating.

Incidentally, there is a problem that it is difficult for the thin film deposited by the aforementioned MOCVD method to obtain flatness of the film surface. Particularly, the problem described above becomes remarkable in the MOVCD method in which the deposition rate of the thin film is determined by the surface-reaction rate controlling. It is known that there occurs a time lag for the thin film to start deposition on the surface of the substrate in the surface-reaction rate controlling. This time is called incubation time. It is considered that a nucleation process in which deposition in island shape is performed on the substrate occurs during this incubation time and that the flatness of the thin film is lost by formation of irregularities in this nucleation process.

A conceptual view of the irregularities on a thin film 31 formed on the substrate 4 is shown in FIG. 7. It is assumed that a projecting part 33 on the surface 32 of the thin film is formed during the nucleation process. Difference between the maximum value of the projecting part 33 and the minimum value of a concave part 34 indicates height difference H in the irregularities, and this difference H is called flatness, showing that the flatness is inferior when the difference is large and the flatness is superior when the difference is small.

A conceptual view of generation of a nucleus (formation of an island) which is assumed to occur during the incubation time is shown in FIG. 8. The foundation of the formed film is the silicon substrate 4, the silicon substrate 4 with an $SiO_2$ film thinly applied on the surface thereof, or the silicon substrate 4 with a $Si_3N_4$ film applied on the surface thereof. A nucleus 35 is formed on the surface of the substrate or on the surface of the foundation film 30. This nucleus 35 grows to be a thin film. At this time, while a film tends to adhere to the nucleus 35 easily, the film tends not to adhere to the surface of the substrate or to the surface of the foundation film 30 easily on which the nucleus 35 is not formed. Therefore, it is difficult for the thin film deposited by the MOCVD method to obtain flatness of the surface of the thin film 32 as shown in FIG. 7.

This flatness of the surface of the thin film 32 is a factor to lower the reliability of the semiconductor device which is an end product and produces a big problem with downsizing of the device.

Following publications are disclosed as publicly known examples of a conventional film-forming technique in use of CVD.

(1) Japanese Patent Laid-opened No. Hei 9-82696 (publicly known example 1)

The publicly known example 1 is a method for forming a silicon oxide film having a desired film thickness by repeating a condensed film forming process (first step), in which an oxygen radical and an organic silane gas (TEOS) are supplied concurrently at a low temperature (−50 to +50° C.) to form a condensed film of a silicon oxide film by a condensed CVD method, and a modifying process (second step), in which the temperature of the substrate is set high (400° C. to 600° C.) thereafter while the oxygen radical is kept supplied and the condensed film is thermally processed in an oxygen radical atmosphere to be modified (removal of impurities such as C, H, and the like), more than once in the same reaction chamber. A thinner film than a film which is to be formed finally is formed in the first step and the condensed film is modified in the second step, whereby the impurities such as C, H, and the like can be removed evenly.

(2) Japanese Patent Laid-opened No. 2001-68485 (publicly known example 2)

The publicly known example 2 is a method which includes steps of growing a low temperature growth ZnO layer by concurrently radiating a Zn beam and an oxygen radical beam onto a sapphire substrate at a temperature lower than a single crystal ZnO growth temperature (200 to 600° C.) (first step), thermally processing (flattening processing) the low temperature growth ZnO layer at a temperature (600 to 800° C.) higher than the growth temperature of the low temperature growth ZnO layer while radiating the oxygen radical beam (second step), and growing a high temperature growth single crystal ZnO layer on the low temperature growth ZnO layer by concurrently radiating the Zn beam and the oxygen radical beam at 600 to 800° C. (third step). Superior crystallinity is made in such a manner that the low temperature growth ZnO layer which is formed in the first step is flattened in the second step and then the high temperature growth single crystal ZnO layer is grown in the third step.

(3) Japanese Patent Laid-open No. Hei 6-45322 (publicly known example 3)

In a manufacturing method of a SiN film of the publicly known example 3, a natural oxide film on a surface of a poly-Si film is removed by hydrogen annealing and thereafter a substrate is transferred into a vapor-phase growth furnace of a heat lamp system without being exposed to the air. After the substrate is transferred, $SiH_2Cl_2$ gas and $NH_3$ gas are concurrently supplied onto the poly-Si film at a low temperature (700° C.) to form a first SiN film having a first film thickness (5 angstroms) (first step), and after raising the temperature (700→800° C.), the $SiH_2Cl_2$ gas and the $NH_3$ gas are concurrently supplied to form on the first SiN film a second SiN film having a second film thickness (100 angstroms) which is larger than the first film thickness (second step). Since growth at the low temperature in the first step enhances surface density of a growing nucleus and realizes a film having a superior flatness, it is possible to form a SiN film having a desired film thickness in the second step.

(Patent Document 1)

Japanese Patent Laid-open No. Hei 9-82696 (pages 2 to 9, FIG. 1)

(Patent Document 2)

Japanese Patent Laid-open No. 2001-68485 (pages 2 to 4, FIG. 1)

(Patent Document 3)

Japanese Patent Laid-open No. Hei 6-45322 (pages 2 to 4, FIG. 1)

However, there are following problems in the above-described publicly known examples.

(1) In the publicly known examples 1 and 2, the source gas and the radical are concurrently supplied in the first step (low temperature process). However, since the oxygen radical is highly reactive, particles are generated when the source gas and the oxygen radical are supplied concurrently.

(2) In the film-forming methods such as publicly known examples 1 to 3, which include the second step at the high temperature after the first step at the low temperature, the throughput (productivity) is lowered because the temperature of the substrate is needed to be raised after the first step at the low temperature.

Incidentally, both of the first layer and the second layer (and layers formed thereafter) are formed by the CVD method in the publicly known examples 1 and 3, and both of the first layer and the second layer are formed by an MBE method in the publicly known example 2.

SUMMARY OF THE INVENTION

It is an object of the present invention to provide a manufacturing method of a semiconductor device and a substrate processing apparatus which can improve flatness of a thin film without generating particles. It is another object of the present invention to provide a manufacturing method of a semiconductor device which can improve the flatness of the thin film without lowering productivity.

A first invention is a manufacturing method of a semiconductor device which is characterized in that it comprises a first thin film layer forming step of, after making a source gas adhere onto a substrate while a temperature of the substrate is lower than a temperature of film forming by a thermal CVD method, supplying a reactant different from the source gas onto the substrate to thereby form a first thin film layer; and a second thin film layer forming step of, after raising the temperature of the substrate up to the temperature of film forming by the thermal CVD method, forming a second thin film layer on the first thin film layer by the thermal CVD method using the source gas, and that the first thin film layer forming step and the second thin film layer forming step are performed in one reaction chamber, and the first thin film layer forming step is performed in the middle of the substrate temperature increase for raising the temperature of the substrate up to the temperature of film forming by the thermal CVD method before the supply of the source gas for forming the second thin film layer.

In the first thin film layer forming step, the source gas adheres onto the substrate while the temperature of the substrate is lower than the temperature of film forming by the thermal CVD method so that the source gas is allowed to adhere onto the substrate in yet unreacted state. Since the reactant different from the source gas is supplied thereafter to cause a film-forming reaction by which the film is forcibly formed, an incubation time does not occur so that a nucleation process can be omitted. Therefore, the first thin film layer excellent in flatness can be formed. Further, in the second thin film layer forming step, the second thin film layer is formed on the first thin film layer excellent in flatness so that a thin film with improved flatness can be formed. Moreover, the formation of the second thin film layer by the thermal CVD method makes it possible to obtain a better film quality compared with a quality obtained by the formation by an ALD method. Further, though the first thin film layer may be formed while the set temperature lower than the temperature of film forming by the thermal CVD method is maintained, its formation while the temperature is raised up to the temperature of film forming by the thermal CVD method enables the improvement in flatness of the first thin film layer, which leads to the improvement in flatness also of the second thin film layer, without lowering productivity.

A second invention is a manufacturing method of a semiconductor device which is characterized in that, in the first invention, the supply of the source gas and the supply of the reactant onto the substrate are repeated a plurality of times in the first thin film layer forming step.

The supply of the source gas and the supply of the reactant are repeated a plurality of times so that, even when a portion on which the film is not formed exists partially after the supply of the source gas and the supply of the reactant are performed only once, this portion can be filled, which can further improve flatness.

A third invention is a manufacturing method of a semiconductor device which is characterized in that, in the first invention, a non-reactive gas is supplied between the supply of the source gas and the supply of the reactant onto the substrate in the first thin film forming step.

When the non-reactive gas is supplied between the supply of the source gas and the supply of the reactant, an amount of the source gas adhering onto the substrate becomes even. Further, this can prevent the source gas and the reactant from existing concurrently in an atmosphere so that particle generation can be prevented.

A fourth invention is a manufacturing method of a semiconductor device which is characterized in that, in the first invention, the temperature of the substrate in the first thin film layer forming step is in a range of no lower than 200° C. and no higher than 390° C.

The first thin film layer is formed while the temperature of the substrate is no higher than 390° C. so that even the supply of the source gas does not cause a film-forming rate, which allows the source gas to adhere onto the substrate in yet unreacted state. Meanwhile, the first thin film layer is formed while the temperature of the substrate is no lower than 200° C. so that a film excellent in adhesiveness to the substrate can be formed.

A fifth invention is a manufacturing method of a semiconductor device which is characterized in that, in the first invention, the source gas is an organic source gas.

The present invention, which can improve flatness, has a great advantage especially when the organic source gas with which flatness on the film surface is not easily obtained is used.

The sixth invention is a manufacturing method of a semiconductor device which is characterized in that, in the first invention, the source gas is a gas obtained by vaporizing a source including Hf, and the thin film to be formed is a film including Hf.

Here, $HfO_xN_y$ such as $HfO_2$ and HfON, $HfSiO_x$ such as HfSiO, $Hf-Al-O_x$ such as HfSiON and HfAlO, HfAlON, or the like is a concrete example of the film including Hf.

A seventh invention is a manufacturing method of a semiconductor device which is characterized in that, in the first invention, the source gas is a gas obtained by vaporizing $Hf[OC(CH_3)_2CH_2OCH_3]_4$, and the thin film to be formed is a film including Hf.

An eighth invention is a manufacturing method of a semiconductor device which is characterized in that, in the first invention, the reactant includes an oxygen atom.

In spite that the reactant includes the oxygen atom, there is no possibility that the reactant directly causes the substrate to be oxidized since the first thin film layer forming step is carried out in such an order that the source gas adheres onto the substrate, and thereafter, the reactant is supplied onto the substrate.

A ninth invention is a manufacturing method of a semiconductor device which is characterized in that, in the first invention, the reactant includes a gas obtained by activating a gas including an oxygen atom with plasma.

In an embodiment, an oxygen radical can be used as the reactant. Incidentally, the case of supplying the oxygen radical onto the substrate includes not only a case of supplying the oxygen radical onto the substrate after an oxygen containing gas is activated outside the reaction chamber to generate the oxygen radical, but also a case of supplying the oxygen containing gas into the reaction chamber without being activated, and thereafter, supplying onto the substrate the oxygen radical which is generated by heat or the like in the reaction chamber.

A tenth invention is a manufacturing method of a semiconductor device which is characterized in that, in the first invention, the source gas and the reactant are supplied from one supply port.

The source gas and the reactant are supplied from the same supply port so that foreign matter adhering to an inner part of the supply port can be coated with the same film as the film formed on the substrate by this method. This can prevent the foreign matter from reaching the substrate accompanying the flow of the source gas or the reactant. Especially when the source gas and the reactant are supplied onto the substrate in a downflow, this can surely prevent the foreign matter from dropping down onto the substrate during the processing. Further, when the reaction chamber is cleaned with a cleaning gas, such an effect is obtainable that the foreign matter such as byproducts and the cleaning gas adhering to the inner part of the supply port can be removed completely without fail.

An eleventh invention is a manufacturing method of a semiconductor device which is characterized in that, in the first invention, the source gas and the reactant are supplied from different supply ports respectively, and when the source gas is supplied to the substrate from a source gas supply port, a non-reactive gas is supplied to a reactant supply port while, when the reactant is supplied to the substrate from the reactant supply port, the non-reactive gas is supplied to the source gas supply port.

The source gas and the reactant are supplied from the different supply ports so that the formation of a built-up film which is formed also in the inner part of the supply port can be reduced. Further, while one of these source gas and reactant is supplied, the non-reactive gas is supplied from the other supply port, so that it can be avoided that both of them come into contact with each other in each of the supply ports, which can further reduce the formation of the built-up film in the inner part of each of the supply ports.

A twelfth invention is a manufacturing method of a semiconductor device which is characterized in that, in the first invention, the reactant is exhausted so as to bypass the reaction chamber without stopping when the source gas is supplied to the substrate, while the source gas is exhausted so as to bypass the reaction chamber without stopping when the reactant is supplied to the substrate.

The supply of the reactant and the supply of the source gas are continued by causing the reactant and the source gas to flow so as to bypass the reaction chamber so that the source gas or the reactant can be supplied onto the substrate immediately by switching over the flow. Consequently, throughput can be improved.

A thirteenth invention is a manufacturing method of a semiconductor device which is characterized in that, in the first invention, a step of forming a thin film by the thermal CVD method and a step of supplying a reactant to the formed thin film are repeated a plurality of times in the second thin film layer forming step.

After the thin film is formed by the thermal CVD method, the reactant is supplied to this thin film, so that processing such as removing impurities mixed into this thin film can be performed each time one cycle is repeated. Therefore, repeating these steps can improve effectiveness of the impurity removal and so on compared with a case when an ordinary CVD method is simply performed, and thus enables the formation of a good quality film.

A fourteenth invention is a manufacturing method of a semiconductor device which is characterized in that, in the first invention, the first thin film layer forming step or/and the second thin film layer forming step is (are) carried out while the substrate is rotated.

The first thin film layer forming step or/and the second thin film layer forming step is(are) carried out while the substrate is rotated so that flatness of the film to be formed can be enhanced.

A fifteenth invention is a manufacturing method of a semiconductor device which is characterized in that, in the first invention, it further comprises a step of supplying a hydrogen radical onto the substrate before the first thin film layer forming step.

The hydrogen radical is supplied onto the substrate before the first thin film layer is formed so that the surface of the substrate is subjected to cleaning processing and hydrogen termination treatment. This enhances coupling between the substrate and the first thin film layer to improve adhesiveness.

A sixteenth invention is a manufacturing method of a semiconductor device which is characterized in that it comprises: a first thin film layer forming step of, after making a source gas adhere onto a substrate while a temperature of the substrate is lower than a temperature of film forming by a thermal CVD method, supplying a reactant different from the source gas onto the substrate to thereby form a first thin film layer; and a second thin film layer forming step of forming a second thin film layer on the first thin film layer using the source gas after the temperature of the substrate is raised up to the temperature of film forming by the CVD method, and that a step of forming a thin film by the thermal CVD method and a step of supplying a reactant to the formed thin film are repeated a plurality of times in the second thin film layer forming step.

In the first thin film layer forming step, the source gas is allowed to adhere onto the substrate in yet unreacted state while the temperature of the substrate is lower than the temperature of film forming by the thermal CVD method. Since the reactant different from the source gas is thereafter supplied to cause a film-forming reaction by which the film is forcibly formed, an incubation time does not occur so that a nucleation process can be omitted. Therefore, the first thin film layer excellent in flatness can be formed. Further, since the second thin film layer is formed on the first thin film layer excellent in flatness in the second thin film layer forming step, the thin film with improved flatness can be formed. Moreover, in the second thin film layer forming step, after the thin film is formed by the thermal CVD method, the reactant is supplied to this thin film so that processing of removing impurities (for example, C, H, and so on) which are mixed into this thin film, and so on can be performed each time one cycle is repeated. Therefore, repeating these steps can improve effectiveness of the impurity removal and so on compared with a case when an ordinary CVD method is simply performed, and thus enables the formation of a good quality film.

A seventeenth invention is a manufacturing method of a semiconductor device which is characterized in that, in the sixteenth invention, the supply of the source gas and the supply of the reactant onto the substrate are repeated a plurality of times in the first thin film layer forming step.

The supply of the source gas and the supply of the reactant are repeated a plurality of times so that, even when a portion on which the film is not formed exists partially after the supply of the source gas and the supply of the reactant are performed only once, this portion can be filled, which can further improve flatness.

An eighteenth invention is a manufacturing method of a semiconductor device which is characterized in that it comprises: a first thin film layer forming step of, after making a source gas adhere onto a substrate while a temperature of the substrate is lower than a temperature of film forming by a thermal CVD method, supplying onto the substrate a reactant which is obtained by activating a gas including an oxygen atom with plasma, to thereby form a first thin film layer; and a second thin film layer forming step of forming a second thin film layer on the first thin film layer by the thermal CVD method using the source gas after the temperature of the substrate is raised up to the temperature of film forming by the thermal CVD method.

In the first thin film layer forming step, the source gas is allowed to adhere onto the substrate in yet unreacted state while the temperature of the substrate is lower than the temperature of film forming by the thermal CVD method. Since the reactant is thereafter supplied to cause a film-forming reaction by which the film is forcibly formed, an incubation time does not occur so that a nucleation process can be omitted. Therefore, the first thin film layer excellent in flatness can be formed. Further since the second thin film layer is formed on the first thin film layer excellent in flatness in the second thin film layer forming step, the thin film with improved flatness can be formed. Moreover, since the second thin film layer is formed by the thermal CVD method, a better film quality is obtainable compared with a case when the film is formed by an ALD method. Further, the processing is carried out in such an order that the reactant, which is obtained by activating the gas including the oxygen atom with plasma, is supplied onto the substrate after the source gas adheres onto the substrate, so that there is no possibility that the reactant may directly oxidize the substrate.

A nineteenth invention is a manufacturing method of a semiconductor device which is characterized in that it comprises: a step of making a source gas adhere onto a substrate; and a step of supplying onto the substrate a reactant which is obtained by activating a gas including an oxygen atom with plasma, to thereby form a film, and that the above steps of the adhesion of the source gas and the supply of the reactant onto the substrate are repeated in this order a plurality of times.

Since the reactant is supplied after the source gas adheres onto the substrate to cause a film-forming reaction by which the film is forcibly formed, an incubation time does not occur so that a nucleation process can be omitted. Therefore, a film excellent in flatness can be formed. Further, since the processing is carried out in such an order that the reactant, which is obtained by activating the gas including the oxygen atom with plasma, is supplied onto the substrate after the source gas adheres onto the substrate, there is no possibility that the reactant may directly oxidize the substrate. Therefore, even when the aforesaid steps are repeated a plurality of times, such an effect is obtainable that the formation of a low dielectric constant film can be prevented.

A twentieth invention is a substrate processing apparatus which is characterized in that it comprises: a processing chamber which processes a substrate; a heater which heats the substrate in the processing chamber; a source gas supply system which supplies a source gas; a reactant supply system which supplies a reactant different from the source gas; an exhaust port which exhausts the processing chamber; and a controller which carries out an control operation in such a manner that the reactant is supplied onto the substrate after the source gas is supplied to adhere onto the substrate while a temperature of the substrate is raised up to a temperature of film forming by a thermal CVD method, and thereafter, the source gas is supplied onto the substrate after the temperature of the substrate is raised up to the temperature of film forming by the thermal CVD method.

A twenty-first invention is a manufacturing method of a semiconductor device which is characterized in that it comprises: a first thin film layer forming step of, after supplying a source gas onto a substrate to adhere onto the substrate in yet unreacted state while a temperature of the substrate is lower than a temperature of film forming by a thermal CVD method, supplying an oxygen radical onto the substrate to thereby form a first thin film layer; and a second thin film layer forming step of, after raising the temperature of the substrate up to the temperature of film forming by the thermal CVD method, supplying the source gas onto the substrate to thereby form a second thin film layer on the first thin film layer by the thermal CVD method.

A twenty-second invention is a manufacturing method of a semiconductor device which is characterized in that, in the twenty-first invention, the first thin film layer is formed during the increase in the substrate temperature in which the temperature of the substrate is raised up to the temperature of film forming by the thermal CVD method, before the supply of the source gas for forming the second thin film layer.

A twenty-third invention is a manufacturing method of a semiconductor device which is characterized in that, in the twenty-first and twenty-second inventions, the supply of the source gas and the supply of the oxygen radical onto the substrate are repeated a plurality of times in the first thin film layer forming step.

A twenty-fourth invention is a manufacturing method of a semiconductor device which is characterized in that, in the twenty-first to twenty-third inventions, a non-reactive gas is supplied between the supply of the source gas and the supply of the oxygen radical onto the substrate in the first thin film layer forming step.

A twenty-fifth invention is a substrate processing apparatus which is characterized in that it comprises: a reaction chamber which processes a substrate; a heater which heats the substrate in the reaction chamber; a source gas supply port which supplies a source gas into the reaction chamber; a radical supply port which supplies an oxygen radical into the reaction chamber; and a controller which performs a control operation in such a manner that, after the substrate is heated by the heater and the source gas in yet unreacted state is supplied to adhere onto the substrate in the reaction chamber while a temperature of the substrate is lower than a temperature of film forming by a thermal CVD method, the oxygen radical is supplied onto the substrate in the reaction chamber to thereby form a first thin film layer, and thereafter, the source gas is supplied onto the substrate in the reaction chamber after the temperature of the substrate is raised up to the temperature of film forming by the thermal CVD method, to thereby form a second thin film layer.

The controller is provided which carries out the control operation in such a manner that the oxygen radical is supplied onto the substrate after the source gas in yet unreacted state adheres onto the substrate, and thereafter, the source gas is supplied onto the substrate after the temperature increase up to the temperature of film forming by the thermal CVD method, so that the manufacturing method of the semiconductor device according to the aforesaid twenty-first invention can be easily carried out. Incidentally, the manufacturing method of the semiconductor device according to the twenty-second invention can be easily carried out when a controller is further provided which carries out a control operation in such a manner that the oxygen radical is supplied onto the substrate after the source gas in yet unreacted state is supplied to adhere onto the substrate in the reaction chamber while the temperature of the substrate is raised. Further, the manufacturing method of the semiconductor device according to the twenty-third invention can be easily carried out when a controller is further provided which carries out a control operation in such a manner that the supply of the source gas and the supply of the oxygen gas are repeated a plurality of times. Moreover, the manufacturing method of the semiconductor device according to the twenty-fourth invention can be easily carried out by providing a non-reactive gas supplier which supplies a non-reactive gas and a controller which carries out a control operation in such a manner that a non-reactive gas is supplied between the supply of the source gas and the supply of the oxygen radical.

A twenty-sixth invention is a manufacturing method of a semiconductor device or a substrate processing apparatus which is characterized in that, in the twenty-first to twenty-fifth inventions, a hydrogen radical is supplied onto the substrate before the first thin film layer is formed.

A twenty-seventh invention is a manufacturing method of a semiconductor device or a substrate processing apparatus which is characterized in that, in the twenty-first to twenty-fifth inventions, the source gas is an organic source gas.

A twenty-eighth invention is a manufacturing method of a semiconductor device or a substrate processing apparatus which is characterized in that, in the twenty-first to twenty-fifth inventions, the source gas is a gas obtained by vaporizing $Hf[OC(CH_3)_2CH_2OCH_3]_4$, and a thin film to be formed is an $HfO_2$ film. Incidentally, when the film is formed by the CVD method using an organic source, an oxygen containing gas is usually supplied together, but in the case of using $Hf[OC(CH_3)_2CH_2OCH_3]_4$, a mixed amount of particular elements (impurities) such as C and H can be made smaller when the oxygen containing gas is not supplied together.

A twenty-ninth invention is a manufacturing method of a semiconductor device or a substrate processing apparatus which is characterized in that, in the twenty-eighth invention, the temperature of the substrate in the first thin film layer forming step is no lower than 200° C. and no higher than 390° C.

A thirtieth invention is a manufacturing method of a semiconductor device or a substrate processing apparatus which is characterized in that, in the twenty-first to twenty-fifth inventions, the second thin film layer forming step includes a film forming step of forming a thin film and a step of supplying an oxygen radical to the formed thin film.

The step of supplying the oxygen radical to the thin film is provided in addition to the film-forming step of forming the thin film, and this step removes particular elements (impurities such as C and H, or the like), so that the impurities or the like such as C and H, which are particular elements, in the film formed in the second thin film layer forming step can be effectively removed.

A thirty-first invention is a manufacturing method of a semiconductor device or a substrate processing apparatus which is characterized in that, in the twenty-first to twenty-fifth inventions, the second thin film layer forming step includes a film-forming step of forming a thin film and a step of supplying an oxygen radical to the formed thin film, and these steps are repeated a plurality of times to thereby form a thin film layer having a desired film thickness.

In the second thin film layer forming step, the film-forming step and the oxygen radical supply step are repeated a plurality of times so that the thin film layer having a predetermined film thickness can be formed and a removal amount of particular elements (impurities such as C and H) in the film formed in the second thin film layer forming step can be increased.

A thirty-second invention is a manufacturing method of a semiconductor device or a substrate processing apparatus which is characterized in that, in the twenty-first to twenty-fifth inventions, at least the first thin film layer forming step is carried out while the substrate is rotated. When at least the first thin film layer forming step is carried out while the substrate is rotated, uniform processing over the surface of the substrate can be realized so that flatness of the first thin film layer and further flatness of the second thin film layer which is formed thereon are enhanced.

A thirty-third invention is a manufacturing method of a semiconductor device or a substrate processing apparatus which is characterized in that, in the twenty-first to twenty-fifth inventions, both of the first thin film layer forming step and the second thin film layer forming step are carried out while the substrate is rotated.

A thirty-fourth invention is a manufacturing method of a semiconductor device or a substrate processing apparatus which is characterized in that, in the twenty-first to twenty-fifth inventions, the source gas and the oxygen radical are supplied from different supply ports respectively.

A thirty-fifth invention is a manufacturing method of a semiconductor device or a substrate processing apparatus which is characterized in that, in the twenty-fourth invention, a non-reactive gas is supplied from an oxygen radical supply port when the source gas is supplied onto the substrate, while a non-reactive gas is supplied from a source gas supply port when the oxygen radical is supplied onto the substrate.

A thirty-sixth invention is a manufacturing method of a semiconductor device or a substrate processing apparatus which is characterized in that, in the twenty-fourth invention, the oxygen radical is made to flow so as to bypass the reaction chamber without being stopped when the source gas is supplied onto the substrate, while the source gas is made to flow so as to bypass the reaction chamber without being stopped when the oxygen radical is supplied onto the substrate.

DETAILED DESCRIPTION OF THE PREFERRED EMBODIMENTS

Hereinafter, embodiments of the present invention will be explained. In the embodiments, such a case will be explained that an amorphous $HfO_2$ film (it will be simply referred to as the $HfO_2$ film below) is formed by a MOCVD method.

First Embodiment

Figure 9:
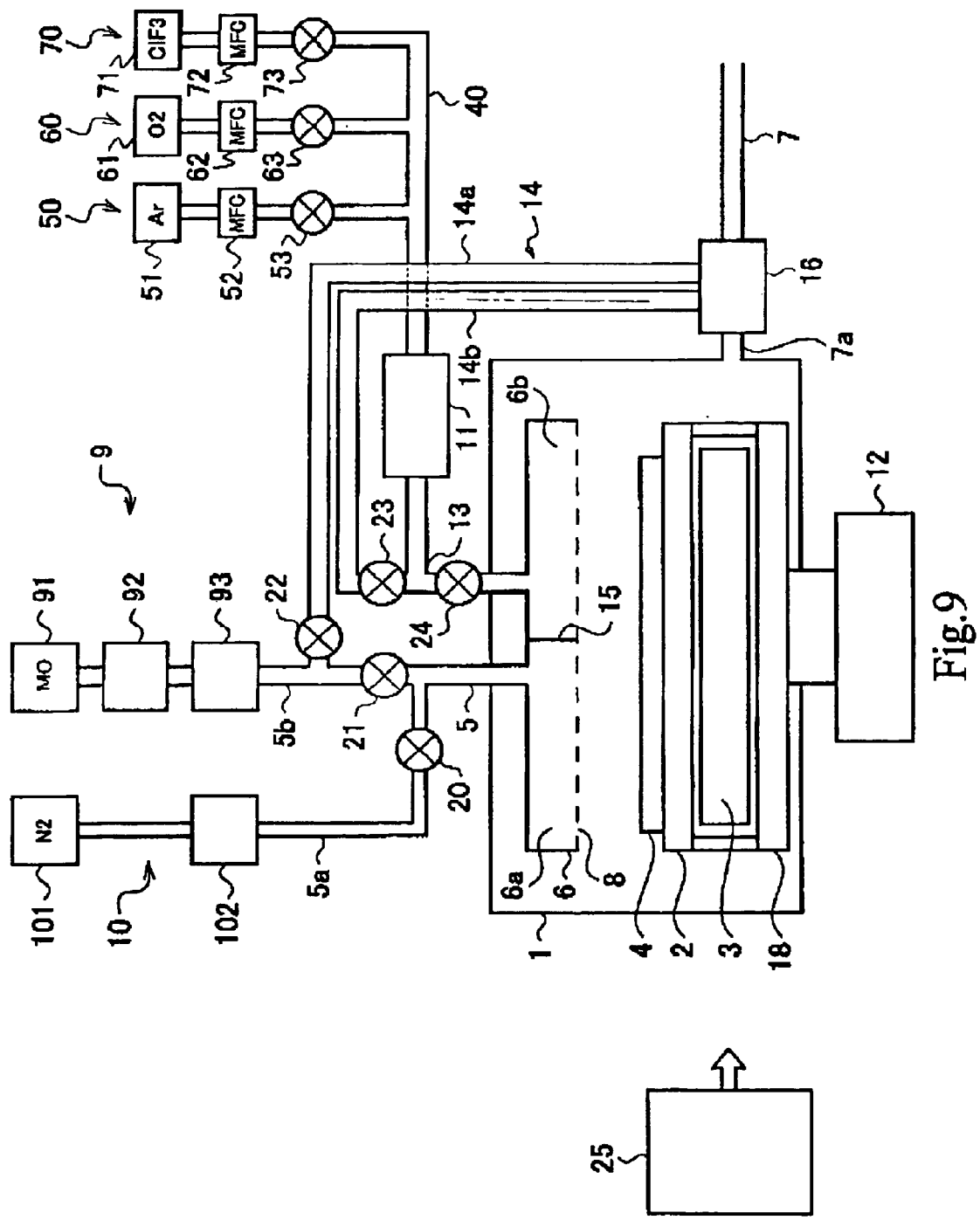
FIG. 9 is a schematic illustrative view of a reaction chamber according to the embodiments.
Figure 10:
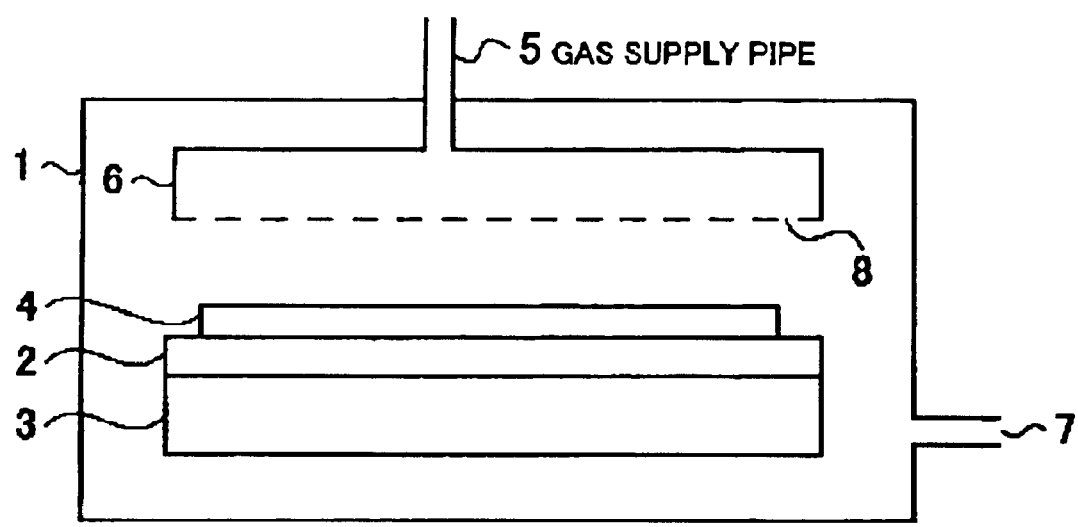
FIG. 10 is a schematic illustrative view of a CVD reaction chamber according to the conventional example.

FIG. 9 is a schematic view showing an example of a single wafer type CVD apparatus which is a substrate processing apparatus relating to the embodiments. A radical generating unit 11, a substrate rotating unit 12, an inert gas supply unit 10 and bypass pipes 14 are mainly added to a conventional reaction chamber 1 (FIG. 10).

A hollow heater unit 18 whose upper opening is covered with a susceptor 2 is provided in the reaction chamber 1 as shown in FIG. 9. A heater 3 is provided in the heater unit 18 and the heater 3 is adapted to heat a substrate 4 mounted on the susceptor 2 to a predetermined temperature. The substrate 4 mounted on the susceptor 2 is, for example, a semiconductor silicon wafer, a glass substrate, or the like.

The substrate rotating unit 12 is provided outside the reaction chamber 1 and the substrate 4 on the susceptor 2 can be rotated by rotating the heater unit 18 in the reaction chamber 1. The substrate 4 is rotated so that a source gas introduced from a film-forming source supply unit 9 which is described later, an inert gas introduced from the inert gas supply unit 10, and a radical introduced from the radical generating unit 11 reach a surface of the substrate 4 evenly. By this rotation, in a first thin film layer forming step which is described later, it is possible to make the source gas adhere to the surface of the substrate 4 evenly in yet unreacted state, and to supply the oxygen radical, which is a reactant different from the source gas, evenly to the source gas which adheres to the surface of the substrate 4 evenly, thereby allowing a reaction evenly over the surface of the substrate 4. Therefore, it is possible to form an even first thin film layer over the surface of the substrate. Additionally, in a second thin film layer forming step which is described later, it is possible to form a second thin film layer evenly over the surface of the substrate and to remove impurities such as C, H, and the like which are particular elements in the formed film quickly and evenly from the surface of the substrate.

A showerhead 6 having many holes 8 is provided above the susceptor 2 in the reaction chamber 1. The showerhead 6 is divided into a film-forming showerhead portion 6a and a radical showerhead portion 6b by a partition plate 15, so that it is possible to produce jets of showered gases separately from the divided showerhead portions 6a and 6b.

The film-forming source supply unit 9 which supplies the source gas and the inert gas supply unit 10 which supplies the inert gas as a non-reactive gas are provided outside the reaction chamber 1.

The film-forming source supply unit 9 has a liquid source supply unit 91 which supplies an organic liquid source such as MO (Metal Organic) as a film-forming source, a liquid flow amount controller 92 as a liquid amount controller which controls a liquid supply amount of the film-forming source, and a vaporizer 93 which vaporizes the film-forming source. As the film-forming source, an organic material such as Hf-(MMP)$_4$ is used.

The inert gas supply unit 10 has an inert gas supply source 101 which supplies the inert gas as the non-reactive gas and a mass flow controller 102 as a flow amount controller which controls a supply amount of the inert gas. As the inert gas, Ar, He, N$_2$, or the like is used.

A source gas supply pipe 5b provided in the film-forming source supply unit 9 and an inert gas supply pipe 5a provided in the inert gas supply unit 10 are integrated to communicate with a source supply pipe 5 connected to a film-forming showerhead portion 6a. Note that a source gas supply system of the present invention is constituted by including the film-forming source supply unit 9, the source gas supply pipe 5b, the source supply pipe 5, a valve, and so on.

The source supply pipe 5 is adapted to supply a mixed gas of the source gas and the inert gas to the film-forming showerhead portion 6a of the showerhead 6 in the first thin film layer forming step and the second thin film layer forming step in which the HfO$_2$ film is formed on the substrate 4. The source gas supply pipe 5b and the inert gas supply pipe 5a are provided with valves 21 and 20 respectively, and by opening/closing these valves 21 and 20 it is possible to control the supply of the mixed gas of the source gas and the inert gas.

The radical generating unit 11 which generates the radical is provided outside the reaction chamber 1. The radical generating unit 11 is constituted of, for example, a remote plasma unit. An argon supply unit 50, an oxygen supply unit 60, and a ClF$_3$ supply unit 70 which supply argon (Ar), oxygen (O$_2$), and chlorine fluoride (ClF$_3$) respectively via a gas supply pipe 40 are connected to an upstream side of the radical generating unit 11.

These units 50, 60, 70 respectively have gas supply sources 51, 61, 71, mass flow controllers 52, 62, 72 as flow amount controller which control supply amounts of the corresponding gases, and valves 53, 63, 73 which turn on/off the flows of the corresponding gases to the gas supply pipe 40.

The controller 25 controls opening/closing of the valves 53, 63, 73 so that argon (Ar) which is a gas for plasma generation, oxygen O$_2$ which is used at the time of the film forming in the first thin film layer forming step and at the time of removing the impurities in the second thin film layer forming step, and ClF$_3$ which is used in a cleaning step of removing a built-up film formed on components other than the substrate can be selectively supplied to the radical generating unit 11. The gases supplied from these gas supply units 50, 60, 70 are activated with, for example, plasma, in the radical generating unit 11 so that the radical as a reactant is generated.

A radical supply pipe 13 connected to the radical showerhead portion 6b is provided on a downstream side of the radical generating unit 11 so that the oxygen radical or chloride fluoride radical as the reactant is supplied to the radical showerhead portion 6b of the showerhead 6 in the first thin film layer forming step, the second thin film layer forming step, or the cleaning step. Further, a valve 24 is provided in the radical supply pipe 13 so that opening/closing of the valve 24 enables the control of the radical supply. Note that a reactant supply system of the present invention is constituted by including the argon supply unit 50, the oxygen supply unit 60, the gas supply pipe 40, the radical generating unit 11, the radical supply pipe 13, the valve 24, and so on.

The radical generating unit 11 supplies a generated radical into the reaction chamber 1 in the first thin film layer forming step, the second thin film layer forming step and the cleaning step. For the radical as the reactant used in the first thin film layer forming step and the second thin film layer forming step, an oxygen radical, for example, is preferable when an organic material such as Hf-(MMP)$_4$ or the like is used for the source. This is because a film-forming reaction, in which a film is forced to be formed by supplying an oxygen radical onto the substrate 4 to which the source gas adheres in yet unreacted state, is performed in the first thin film layer forming step. This is also because a removing process of impurities such as C, H, and the like can be performed efficiently immediately after forming the HfO$_2$ film in the second thin film layer forming step. For the radical used in the cleaning step to remove a built-up film formed also on the component other than the substrate, ClF$_3$ radical is preferable.

The source supply pipe 5 provided in the reaction chamber 1 and the film-forming showerhead portion 6a, and the radical showerhead portion 6b including the radical supply pipe 13 and so on constitute different supply ports which supply the source gas to be supplied to the substrate 4 and the radical to be supplied to the substrate 4, respectively. The supply port including the film-forming showerhead portion 6a is the source gas supply port, and the supply port including the radical showerhead portion 6b is the radical supply port.

However, in one modification example of the present invention, the partition plate 15 can be omitted. In this case, the source gas such as Hf-(MMP)$_4$ and the reactant such as the oxygen radical are supplied from the same supply port. The supply port in this case indicates the supply port including the entire showerhead 6. In other words, in this case, a common supply port in the showerhead 6 is used as the aforesaid source gas supply port and the radical supply port. This can simplify the structure of the apparatus in accordance with the omission of the partition plate 15, and the source gas and the reactant are ejected from all the holes 8 in the entire showerhead 6 so that they can be supplied more evenly over the surface of the substrate 4.

An exhaust port 7a which exhausts the reaction chamber is provided in the reaction chamber 1, and the exhaust port 7a is connected to an exhaust pipe 7 which communicates to a not-shown eliminating apparatus. A source recovery trap 16 which recovers the source gas is provided at the exhaust pipe 7. This source recovery trap 16 is used in common in the first thin film layer forming step, the second thin film layer forming step and the cleaning step. An exhaust system is composed of the exhaust port 7a and the exhaust pipe 7.

A source gas bypass pipe 14a and a radical bypass pipe 14b (these are referred to simply as bypass pipes 14) connected to the source recovery trap 16 which is provided at the exhaust pipe 7 are provided at the source gas supply pipe 5b and the radical supply pipe 13 respectively. The source gas bypass pipe 14a and the radical bypass pipe 14b are provided with valves 22 and 23 respectively. By using this structure, when supplying the source gas to the substrate 4 in the reaction chamber 1, the radical is exhausted through the radical bypass pipe 14b and the source recovery trap 16 so that the radical bypasses the reaction chamber 1 without stopping the supply of the radical. When supplying the radical onto the substrate 4 in the reaction chamber 1, the source gas is exhausted through the source gas bypass pipe 14a and the source recovery trap 16 so that the source gas bypasses the reaction chamber 1 without stopping the supply of the source gas. That is, both of the supply of the source gas from the film-forming source supply unit 9 and the supply of the radical from the radical generating unit 11 are not stopped and constantly kept flowing at least during the processing of the substrate.

The controller 25 which controls the opening/closing and the like of the valves 20 to 24 is provided. The controller 25 controls the heater to raise the temperature of the substrate by heating the substrate 4 up to the film-forming temperature at a predetermined rate and to keep the film-forming temperature after the temperature is raised. In the first thin film layer forming step, the controller 25 also controls such that the source gas is supplied from the film-forming showerhead portion 6a to adhere to the substrate 4 in yet unreacted state in a condition that the temperature of the substrate is lower than the film-forming temperature (for example, while raising the temperature of the substrate) and thereafter the oxygen radical is supplied from the radical showerhead portion 6b to the substrate 4. The controller 25 then controls the supply of the source gas and the supply of the oxygen radical onto the substrate 4 to repeat more than once. Furthermore, in the second thin film layer forming step, the controller 25 controls such that the source gas is supplied from the film-forming showerhead portion 6a onto the substrate 4 to form a film after the temperature of the substrate is raised to the film-forming temperature and thereafter the oxygen radical is supplied to the formed thin film. The controller 25 then controls the supply of the source gas and the supply of the oxygen radical onto the substrate 4 to repeat more than once. During this period, the controller 25 controls such that the reaction chamber 1 is constantly exhausted from the exhaust port 7a. The controller 25 also controls such that the inert gas (Ar, He, $N_2$, or the like) is supplied at intervals of the supply of the source gas and the supply of the oxygen radical.

Next, a step will be illustrated, in which the $HfO_2$ film is formed by controlling the incubation time with the substrate processing apparatus which has the above-described structure in FIG. 9 and a process which is different from the conventional one.

Figure 1:
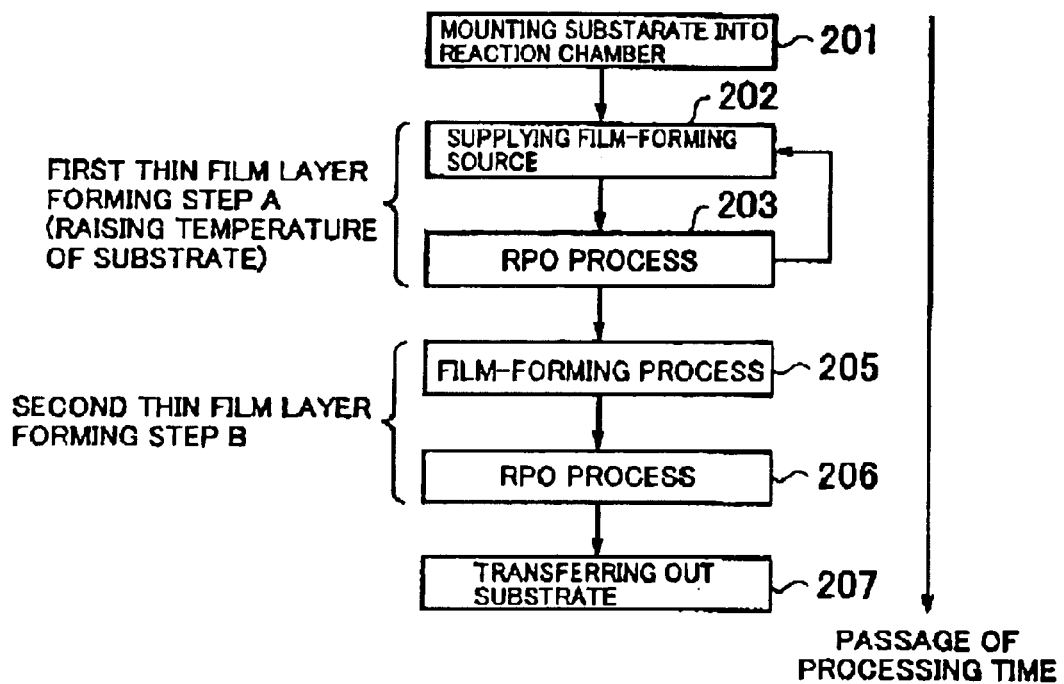
FIG. 1 is a process flow chart according to a first embodiment.

A process flow of the first embodiment is illustrated in FIG. 1. Before mounting the substrate 4 in the reaction chamber 1, only the valve 20 is opened and only the $N_2$ gas which is the inert gas is caused to flow in the reaction chamber 1 at 1 to 5 slm. Thereafter, the substrate 4 is inserted into the reaction chamber 1 to be mounted on the susceptor 2, and while rotating the substrate 4 by the substrate rotating unit 12, the temperature of the substrate starts to be raised in order to heat the substrate 4 evenly up to 350 to 500° C. which is the film-forming temperature by supplying the power to the heater 3 (step 201). Incidentally, the film-forming temperature depends on reactivity of the organic material in use, and when Hf-(MMP)$_4$, for example, is used, it is preferable for the temperature to be in the range of 390 to 440° C. In addition, it is possible to prevent particles and metal impurities from adhering to the substrate 4 by opening the valve 20 provided at the inert gas supply pipe 5a and by constantly flowing the inert gas such as Ar, He, $N_2$, or the like at least when the substrate 4 is in the reaction chamber 1, that is, when transferring the substrate 4, when heating the substrate (which includes when heating while raising the temperature of the substrate and when heating during film-forming), or the like. Incidentally, it is more preferable to still flow the inert gas constantly, even when the substrate 4 is not in the reaction chamber 1, that is, before transferring the substrate 4 into the reaction chamber 1, after transferring the substrate 4 out of the reaction chamber 1, and the like.

In a conventional method, the inert gas (such as $N_2$) is simply supplied onto the substrate 4 while the temperature of the substrate is raised. In this embodiment, on the other hand, the first thin film layer forming step A is started while the temperature of the substrate is lower than the temperature of film forming by the thermal CVD method after the increase of the substrate temperature is started. More specifically, first in a film-forming source supply step 202 of the first thin film layer forming step A, a flow amount of the organic liquid source supplied from the liquid source supply unit 91 is controlled by the liquid flow amount controller 92 and the organic liquid source is supplied to the vaporizer 93 for vaporization. Then, while the temperature of the substrate is raised, the valve 21 is opened so that a predetermined amount, for example, 0.1 g/min, of the source gas which is obtained by vaporizing Hf-(MMP)$_4$ as the organic liquid source is supplied from the film-forming source supply unit 9 for about 10 seconds. The source gas is introduced to the film-forming showerhead portion 6a to be supplied onto the substrate 4 on the susceptor 2 in a shower via the many holes 8. Thereafter, the valve 21 is closed and the valve 22 is opened so that the source gas is exhausted through the bypass pipe 14a, thereby stopping the supply of the source gas onto the substrate 4. Through this operation, the film-forming source supply for making the source gas adhere onto the substrate 4 is finished (step 202). In this step, a decomposition reaction of the source gas adhering onto the substrate 4 is prevented due to the low temperature of the substrate. Further, after the aforesaid 10 seconds have passed, the valve 21 provided in the source gas supply pipe 5b is closed and the valve 22 provided in the source gas bypass pipe 14a is opened so that the source gas supplied from the film-forming source supply unit 9 is exhausted through the source gas bypass pipe 14a so as to bypass the reaction chamber 1, and consequently, the supply of the source gas is not stopped.

During this film-forming source supply and the next RPO (remote plasma oxidation) process, the valve 20 which is provided at the inert gas supply pipe 5a remains open and the inert gas such as $N_2$ or the like constantly flows.

After the film-forming source supply step 202, the RPO process (step 203) is performed. Here, the RPO (remote plasma oxidation) process means a remote plasma oxidation process in which a film is oxidized in an atmosphere of the oxygen radical as the reactant which is generated by activating an oxygen containing gas ($O_2$, $N_2O$, NO, or the like) with plasma. In the RPO process, the valve 53 of the Ar gas supply unit 50 is opened in advance, and the Ar gas supplied from the Ar gas supply source 50 is supplied to the radical generating unit 11 while the flow amount thereof is controlled by the mass flow controller 52, so that Ar plasma is generated. After the Ar plasma is generated, the valve 63 of the $O_2$ gas supply unit 60 is opened, and the $O_2$ gas supplied from the $O_2$ gas supply source 61 is supplied to the radical generating unit 11 generating the Ar plasma while the flow amount of the $O_2$ gas is controlled by the mass flow controller 62 so that $O_2$ is activated. Through this operation, the oxygen radical is generated. Then, the valve 24 is opened so that the oxygen radical as the reactant which is generated by activating oxygen with plasma by the radical generating unit 11 is supplied onto the substrate 4 in a shower for about 15 seconds via the radical showerhead portion 6b which is separated from the film-forming showerhead portion 6a. Thereafter, the valve 24 is closed and the valve 23 is opened so that the oxygen radical is exhausted through the bypass pipe 14b so as to bypass the reaction chamber 1. Through this operation, the supply of the oxygen radical onto the substrate 4 is stopped. The oxygen radical is supplied to the source gas adhering to the substrate 4 in yet unreacted state so that the film-forming reaction by which the film is forcibly formed occurs and several to several tens angstroms of an $HfO_2$ film, which is to be the first thin film layer, is deposited on the substrate 4 (step 203). Incidentally, after the aforesaid about 15 seconds have passed, the valve 24 provided in the radical supply pipe 13 is closed and the valve 23 provided in the radical bypass pipe 14b is opened so that the oxygen radical supplied from the radical generating unit 11 is exhausted through the radical bypass pipe 14b so as to bypass the reaction chamber 1, and consequently, the supply of the oxygen radical from the radical generating unit 11 is not stopped.

Conventionally, the thin film is not deposited while raising the temperature of the substrate, but since the thin film of the first layer is deposited while raising the temperature of the substrate in this embodiment, the $HfO_2$ film which becomes the first layer is already formed after the temperature of the substrate is completely raised. Therefore, since the HfO$_2$ film of the second layer is formed by using the HfO$_2$ film of the first layer as a foundation when the source gas is supplied onto the substrate 4 after raising the temperature of the substrate, an incubation time which is generated in the conventional method is not generated and a nucleation process can be omitted. As a result, it is considered that the thin film having a superior flatness can be formed.

After the RPO process of the step 203, it needs some time for the temperature of the substrate 4 to be raised to the predetermined film-forming temperature 390 to 440° C. It normally takes 1 minute to 2 minutes and 30 seconds to raise the temperature. During this time, if there is enough time, it is preferable to repeat a cycle of the aforementioned film-forming source supply step 202 and the RPO process step 203 more than once because effectiveness in the flatness is enhanced. Additionally, it is preferable to have an interval gas supply step in which an inert gas such as N$_2$ or the like is supplied between the film-forming source supply step 202 and the RPO process step 203.

After the first thin film layer forming step, when the temperature of the substrate reaches the predetermined temperature of film forming by the thermal CVD method, the second thin film layer forming step B starts. First of all, in the film-forming process of the step 205, the valve 22 is closed and the valve 21 is opened to supply the source gas of the evaporated Hf-(MMP)$_4$ to the substrate 4 in the reaction chamber 1 from the film-forming source supply unit 9. When the valve 20 is left open to keep the inert gas (N$_2$ or the like) flowing from the inert gas supply unit 10 constantly also during this supply of the source gas and the next RPO process (step 206), the source gas is diluted and stirred by the inert gas, which is preferable. The source gas supplied from the source gas supply pipe 5b and the inert gas supplied from the inert gas supply pipe 5a are mixed in the source supply pipe 5, introduced to the film-forming showerhead portion 6a as a mixed gas, and supplied onto the substrate 4 on the susceptor 2 via the many holes 8 in the showered form. By supplying the aforementioned mixed gas for a predetermined time, the HfO$_2$ film of the second thin film layer having a predetermined film thickness is formed on the first thin film layer by a thermal CVD method (step 205). After the aforementioned predetermined time, the supply of the source gas onto the substrate 4 is stopped and the source gas is exhausted through the source gas bypass pipe 14a by closing the valve 21 and opening the valve 22. (Incidentally, though the supply of the source gas onto the substrate 4 is stopped, the supply of the source gas from the film-forming source supply unit 9 is not stopped.)

After the film-forming process of the step 205, the RPO process (the step 206) as a modifying process of modifying the film starts. After closing the valve 21, the valve 24 is opened to supply the oxygen radical, which is the reactant obtained by activating oxygen with plasma, onto the substrate 4 from the radical generating unit 11 for a desired time and to remove impurities such as —OH, —CH, and the like which are the particular elements laced in the film, thereby completing the RPO process. Incidentally, since the substrate 4 is also rotated and kept at the predetermined temperature (the same as the film-forming temperature) by the heater 3 in the second thin film layer forming step B similarly to the first thin film layer forming step A, it is possible to remove the impurities such as C, H, and the like quickly and evenly. After the aforementioned desired time, the supply of the oxygen radical onto the substrate 4 is stopped and the oxygen radical is exhausted through the radical bypass pipe 14b by closing the valve 24 and opening the valve 23. (Incidentally, though the supply of the oxygen radical onto the substrate 4 is stopped, the supply of the oxygen radical from the radical source supply unit 11 is not stopped.)

Here, it is also preferable to repeat a cycle of the film-forming process step 205 and the RPO process step 206 more than once because effectiveness in removing the impurities is enhanced. The film thickness of the second thin film layer at this time is, for example, approximately 50 angstroms in total. The substrate for which processes are completed is transferred outside the apparatus (step 207).

As described above, in the first thin film layer forming step of the low temperature process, this embodiment is different from the conventional example in which the gas and the radical are concurrently supplied, in that the source gas and the oxygen radical are not concurrently supplied but a single species is each supplied or a single species is each supplied alternately more than once in this embodiment. It is a reason for this that a film-forming reaction is performed, in which the film is forced to be formed by supplying the oxygen radical as the reactant after the source gas is made adhere to the substrate in yet unreacted state at a lower temperature than the temperature of film forming by the thermal CVD method. It is also a reason that generation of the particles is prevented, which is caused by supplying the oxygen radical having a high reactivity and the source gas concurrently. Incidentally, the supply of the oxygen radical in the first thin film layer forming step also has an effect that it forces the film-forming reaction to proceed and prevents the impurities from being taken into the film as much as possible.

A desired range of the temperature for the first thin film layer forming step A in this embodiment is as follows. In the first thin film layer forming step A, when the temperature of the substrate is too high, the source gas is decomposed to form a film on the substrate, so that it is impossible to make the source gas adhere onto the substrate in yet unreacted state. Therefore, it is considered that the temperature of the substrate is necessary to be at least equal to or lower than 390° C. at which a film-forming rate by the thermal CVD method is not generated. On the contrary, when the temperature of the substrate is too low, adhesiveness between the thin film and the substrate becomes worse and the thin film easily peels off the substrate, whereby it is considered that the temperature is necessary to be at least equal to or more than 200° C. As above, it is considered that the temperature of the substrate in the first thin film layer forming step is preferable to be at least 200° C. no more than 390° C. Incidentally, the condition of a range of pressure and the like may be the same as that of the second thin film layer forming step B described next.

As for the preferred condition for the film-forming step in the second thin film layer forming step B, when Hf-(MMP)$_4$ is used for the source, the processing temperature is between 390° C. to 440° C. as described above and the pressure is equal to or lower than approximately 100 Pa. Moreover, as for the preferred condition for the RPO process step after the film-forming step, the processing temperature is between 390° C. to 440° C., the pressure is ranged from approximately 100 to approximately 1000 Pa, the O$_2$ flow amount for generating the radical is 100 sccm, and the inert gas Ar flow amount is 1 slm. Incidentally, it is preferable to perform the film-forming step and the RPO step at substantially the same temperature (The set temperature of the heater is preferably not changed to be constant.). This is because it is possible to prevent the generation of the particles caused by a thermal expansion of peripheral parts such as a shower plate, the susceptor and the like, and also to restrain metal burst from metal parts (metal contamination) by not changing the temperature in the reaction chamber.

Figure 2:
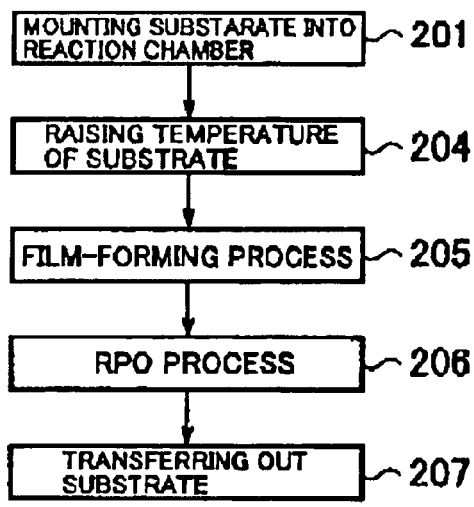
FIG. 2 is a process flow chart according to a conventional example.

A process flow of a conventional example is shown in FIG. 2 to compare it with the process flow of the first embodiment. Though an inert gas ($N_2$ or the like) is simply supplied to the substrate while raising the temperature of the substrate (step 204) in the conventional example, the source gas is additionally supplied while raising the temperature of the substrate and thereafter the radical as the reactant is caused to flow to form the first thin film layer (steps 202 and 203) in the present embodiment. Therefore, since a newly added step for forming an insulating layer which is to be the first thin film layer is performed making use of the time in which the temperature of the substrate is raised in the conventional process, it is possible to improve the flatness of the CVD thin film without lowering productivity.

Moreover, since the second thin film layer is formed adopting the thermal CVD method, the quality of the film becomes superior, which is different from a film formed by an ALD method. That is, though a film is formed atomic layer by atomic layer at a low processing temperature and pressure in ALD (Atomic Layer Deposition), the quality of the film becomes inferior because much impurities are taken into the film since the film is formed at the low temperature from beginning to end. On the other hand, while the first thin film layer forming step A is performed at the temperature (several to several dozen angstroms per cycle) lower than the temperature of film forming by the thermal CVD method in the present embodiment, the second thin film layer forming step B utilizes the thermal CVD reaction in which the processing temperature and pressure are higher than those of the ALD so as to form the thin film (approximately 10 to approximately 15 angstroms) more than once, whereby it is possible to obtain a finer and better quality film than the film obtained by the ALD.

The RPO process (step 206) as the modifying process after the film-forming process (step 205) can effectively remove the impurities such as hydrogen (H) and carbon (C) in the film and the concentration thereof can be lowered so that an electrical property can be enhanced. An electrical property can be also enhanced since the removal of hydrogen (H) restrains the transfer of the Hf atom to prevent crystallization. Further, the oxidization of the film can be promoted and oxygen deficiency in the film can be corrected. Moreover, a detached gas from the built-up film deposited on portions other than the substrate such as a reaction chamber inner wall and the susceptor can be reduced quickly so that film thickness control with high reproducibility is possible.

Incidentally, in this embodiment, the RPO process as the modifying process is performed in the step 206, but the present invention is not limited to this process. For example, the following processes (the following ② to ⑧ can substitute for the RPO process (the following ①).

① a RPO process in which $O_2$ is mixed in the inert gas such as Ar

② an RPN (Remote Plasma Nitridation) process in which $N_2$ or $NH_3$ is mixed in the inert gas such as Ar ③ an RPNH (Remote Plasma Nitridation Hydrogenation) process in which $N_2$ and $H_2$ are mixed in the inert gas such as Ar ④ an RPH (Remote Plasma Hydrogenation) process in which $H_2$ is mixed in the inert gas such as Ar ⑤ an RPOH (Remote Plasma Oxidation Hydrogenation) process in which $H_2O$ is mixed in the inert gas such as Ar ⑥ an RPON (Remote Plasma Oxidation Nitridation) process in which $N_2O$ is mixed in the inert gas such as Ar ⑦ an RPON process in which $N_2$ and $O_2$ are mixed in the inert gas such as Ar ⑧ an RPAr process in which only the inert gas such as Ar is used (this process enables the promotion of the decomposition reaction of an adhering source.)

In the second thin film layer forming step B, a cycle of the film-forming process step 205 and the RPO process step 206 is repeated a plurality of times so that efficiency in removing the impurities in the film can be enhanced as described above. Further, the film is kept in an amorphous state, and as a result, leak current can be reduced. Moreover, flatness of the film surface can be improved to enhance evenness of the film thickness. Besides, the film can be densified (a deficiency correction effect can be maximized), and precise control of the deposit rate is made possible. Moreover, an undesirable interface layer which is formed between the foundation of the formed film and the deposited film can be made thin.

In addition, when a cycle of the film-forming process step 205 and the RPO process step 206 is repeated a plurality of times, a film thickness per cycle is preferably 0.5 Å to 30 Å (⅙ to 10 atomic layer). Especially when about 7 cycles are performed, the effect of reducing an amount of the impurities in the $HfO_2$ film such as CH and OH is extremely high, and even when the number of the cycles is further increased, not much change is seen, though only slight improvement of the effect of reducing an amount of the impurities is seen. Therefore, it is considered to be more preferable that the film thickness per cycle is about 15 Å (5 atomic layers). When the film is deposited to have a thickness of 30 Å or larger per cycle, an amount of the impurities in the film becomes large so that the film is immediately crystallized to be in a polycrystalline state. Since the polycrystalline state is a state without any gaps, the removal of C, H, and so on becomes difficult. However, when the thickness of the film formed per cycle is smaller than 30 Å, a crystalline structure is not easily formed so that the thin film can be kept in the amorphous state even with the impurities. Since the amorphous state has many gaps (a sparse state), when the thin film is deposited while being kept in the amorphous state and the RPO process is performed before the thin film is crystallized, the impurities such as C and H in the film are easily removed. Therefore, the film obtained by performing a plurality of cycles of the processes with the film thickness per cycle being about 0.5 Å to about 30 Å is not easily crystallized. Incidentally, the amorphous state is advantageous in that the leak current is more difficult to flow in this state than in the polycrystalline state.

A timing chart of the above-described process of the first embodiment, in which the first thin film layer forming step [the supply of the source gas→the supply of the oxygen radical] is repeated for n cycles while raising the temperature, is shown in FIG. 3(a) to FIG. 3(c). FIG. 3(a) shows a property of raising temperature of the substrate, in which a horizontal axis indicates time and a vertical axis indicates temperature. FIG. 3(b) shows a timing of supplying the Hf-$(MMP)_4$ source gas and FIG. 3(c) shows a timing of supplying the oxygen radical respectively, in which a horizontal axis indicates time and a vertical axis indicates a supply amount (at any unit). In this embodiment, while the temperature of the substrate is raised to 390° C., a cycle in which after flowing the Hf-$(MMP)_4$ gas for 10 seconds an inert gas $N_2$ is caused to flow for 5 seconds as an interval gas supply step, then the oxygen radical $O_2$ is caused to flow for 15 seconds, and thereafter, the inert gas $N_2$ is caused to flow for 5 seconds as the interval gas supply step, is repeated n times. When the temperature of the substrate reaches 440° C. which is the film-forming temperature, the second thin film layer forming step [the supply of the source gas→the supply of the oxygen radical] is repeated for m cycles. Incidentally, it is preferable to perform the interval gas supply step between the supply of the source gas and the supply of the oxygen radical also in the second thin film layer forming step similarly to the first thin film layer forming step. Additionally, since the inert gas $N_2$ is kept flowing through the all steps, when stopping both of the supply of the source gas and the supply of the oxygen radical into the reaction chamber, only $N_2$ of the inert gas is caused to flow into the reaction chamber by itself, whereby it becomes the interval gas supply step by itself.

Figure 5:
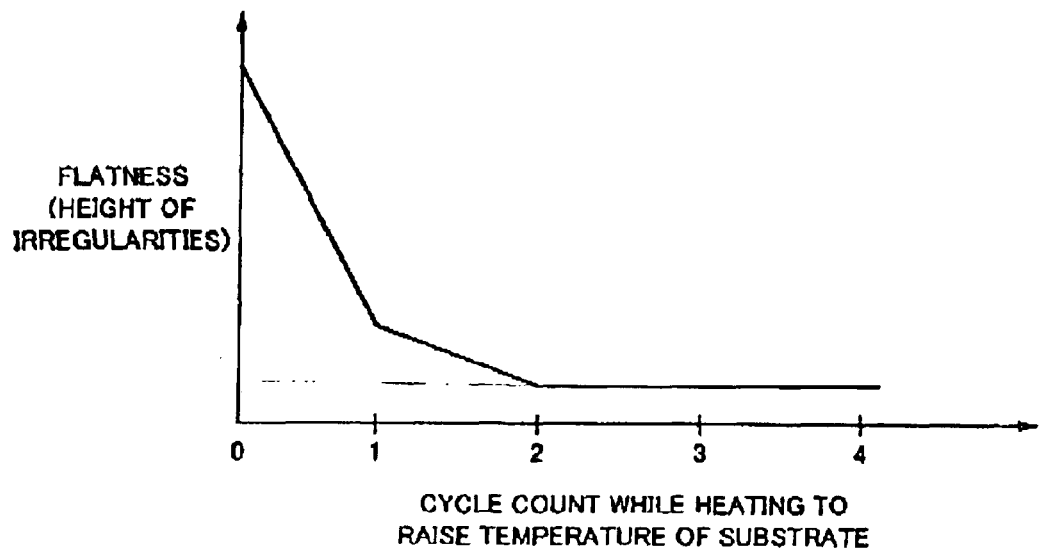
FIG. 5 is a view showing relation between a cycle count and flatness while raising the temperature of the substrate according to the embodiments.

FIG. 5 shows flatness of the thin film formed in the first thin film layer forming step according to the process of this embodiment. A horizontal axis indicates a cycle count while raising the temperature of the substrate and a vertical axis indicates flatness (at any unit). The conventional method corresponds to the point when the cycle count is zero. According to this, it is realized that the flatness of the thin film is improved in accordance with increase in the cycle count while raising the temperature of the substrate though the flatness reaches plateau when the cycle count is equal to or more than two. Therefore, it is possible to improve reliability of the semiconductor device of the end product and to respond to downsizing of the device effectively.

Figure 6:
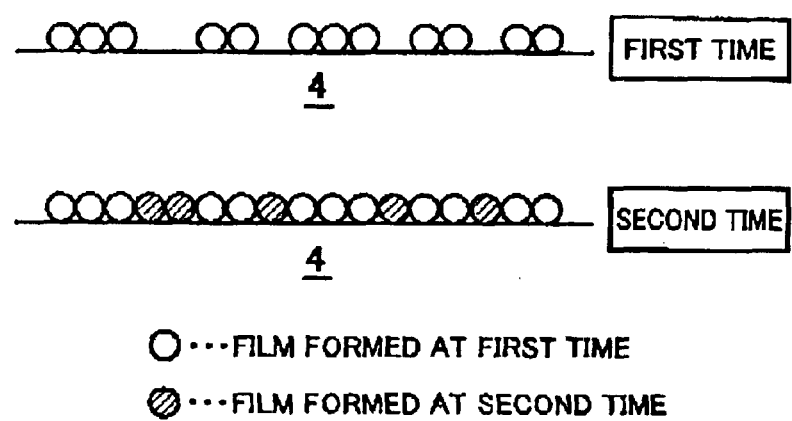
FIG. 6 is an illustrative view of a first thin film layer forming step according to the embodiments.
Figure 7:
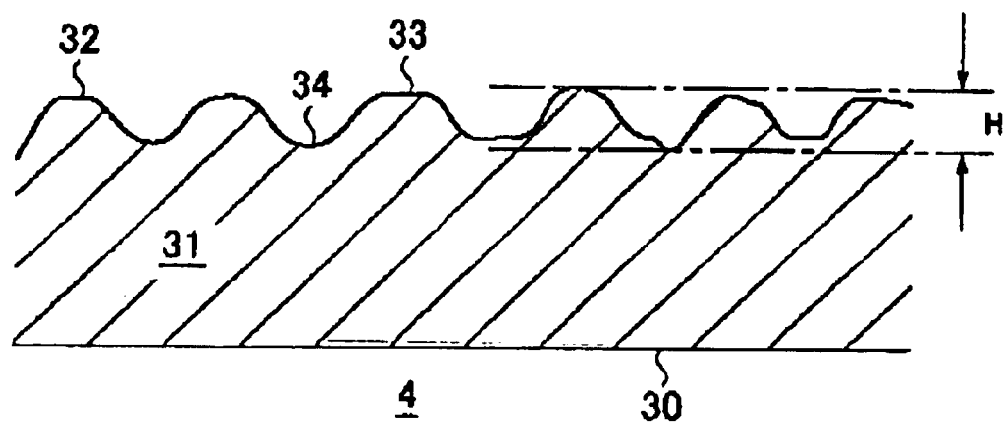
FIG. 7 is a conceptual illustrative view of flatness of a thin film formed on a typical substrate.
Figure 8:
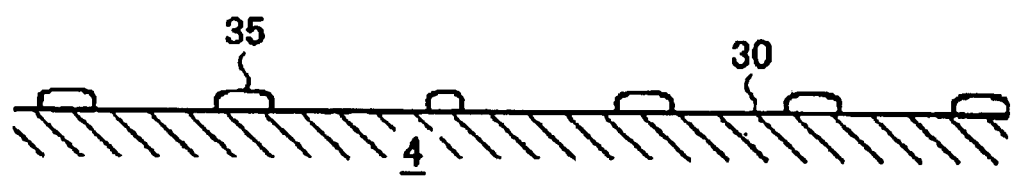
FIG. 8 is a conceptual illustrative view of a typical nucleation process.

By the way, the reason why the supply of the source gas and the supply of the oxygen radical are repeated more than once in the first thin film layer forming step A is as follows. When [the supply of the source gas→the supply of the oxygen radical] is performed to the substrate 4 only once, some portions on which the film is not formed may be generated partially as shown in FIG. 6. In this case, it is possible to fill and make up the portion on which the film is not formed by repeating [the supply of the source gas→the supply of the oxygen radical] more than once, so that the flat first thin film layer can be formed. Therefore, it is possible to shorten the incubation time and to obtain flatness on the film surface of the deposited thin film even in the MOCVD method in which the depositing rate of the thin film is determined by the surface-reaction rate controlling.

Furthermore, the reason why the non-reactive gas is supplied between the supply of the source gas and the supply of the oxygen radical in the first thin film layer forming step or/and the second thin film layer forming step (the interval gas supply step) is as follows. When the non-reactive gas (an inert gas such as $N_2$, Ar, He, or the like) is adapted to be supplied between the supply of the source gas and the supply of the oxygen radical, the amount of the source gas which adheres onto the substrate becomes even by the supply of the inert gas. Additionally, it is possible to remove the source gas in the atmosphere of the reaction chamber when the oxygen radical is supplied after the supply of the source gas, so that the source gas and the oxygen radical cannot be in the reaction chamber at a time, preventing generation of the particles. Furthermore, if the non-reactive gas is adapted to be supplied between the supply of the source gas and the supply of the oxygen radical also when the supply of the source gas and the supply of the oxygen radical are repeated alternately more than once, it is possible to make the adhering amount of the source gas become even, to remove the source gas in the atmosphere when the oxygen radical is supplied after the supply of the source gas, and to make the source gas and the oxygen radical not be in the reaction chamber at a time. As a result, generation of the particles can be prevented.

Furthermore, the reason why the showerhead 6 is divided into the film-forming showerhead portion 6a and the radical showerhead portion 6b is as follows. When the source adhering inside the showerhead 6 and the oxygen radical react on each other, a built-up film is also formed inside the showerhead 6. By dividing the showerhead 6 to which the source gas and the oxygen radical are supplied so as to prevent the reaction between the source and the oxygen radical, it is possible to restrain the formation of the built-up film.

In addition to dividing the showerhead 6, it is preferable to flow the inert gas to the radical showerhead portion 6b from a not-shown inert gas supply unit when the source gas is caused to flow to the substrate 4, and to flow the inert gas to the film-forming showerhead 6a from the inert gas supply unit 10 when the oxygen radical is caused to flow to the substrate 4. Incidentally, it is preferable to use the inert gas supply unit for supplying the inert gas to the radical showerhead portion 6b and the inert gas supply unit for supplying the inert gas to the film-forming showerhead portion 6a in common. In this way, when the inert gas is caused to flow to either one of the showerhead portions 6b or 6a which is not used in the source gas supply step or the oxygen radical supply step respectively, it is possible to restrain the formation of the built-up film inside the showerhead 6 more effectively.

Incidentally, the source gas such as $Hf-(MMP)_4$ and the reactant such as the oxygen radical can be supplied from the same supply port, for example, by the omission of the partition plate 15 or the like, as described above. In this case, foreign matter (particle source) adhering to the supply port, namely, the inner part of the showerhead 6 can be coated with the $HfO_2$ film. This can prevent the foreign matter from reaching the substrate 4 accompanying the flow of the source gas such as $Hf-(MMP)_4$ or the reactant such as the oxygen radical. Especially, in the apparatus shown in FIG. 9, this can surely prevent the foreign matter from dropping down onto the substrate 4 during the process since the source gas and the reactant are supplied onto the substrate 4 in a downflow. Moreover, when the reaction chamber 1 is cleaned with a cleaning gas (for example, a gas including Cl such as $ClF_3$), the foreign matter such as byproducts and the cleaning gas adhering to the inside of the reaction chamber 1 and the inner part of the showerhead 6 can be surely removed without any residual. Further, the film coating the inner part of the showerhead is exposed to the reactant after the coating so that an amount of mixed impurities such as C and H included in the coating film on the inner part of the showerhead can be greatly reduced.

Incidentally, in the cleaning step of removing the built-up film formed on components other than the substrate, the valve 53 of the Ar gas supply unit 50 is opened in advance, and the Ar gas supplied from the Ar gas supply source 50 is supplied to the radical generating unit 11 while the flow amount thereof is controlled by the mass flow controller 52 so that the Ar plasma is generated. After the Ar plasma is generated, the valve 73 of the $ClF_3$ gas supply unit 70 is opened, and the $ClF_3$ gas supplied from the $ClF_3$ gas supply source 71 is supplied to the radical generating unit 11 generating the Ar plasma while the flow amount thereof is controlled by the mass flow controller 73 so that $ClF_4$ is activated. Through this operation, the $ClF_3$ radical is generated. Then, the valve 24 is opened, and the $ClF_3$ radical which is generated by activating $ClF_3$ with plasma by the radical generating unit 11 is supplied to the reaction chamber 1 in a shower via the showerhead 6.

Furthermore, the reason why the oxygen radical/source gas which is used in the next step is not stopped and exhausted through the bypass pipes 14 during the supply of the source gas/oxygen radical to the reaction chamber is as follows. The supply of the source gas and the supply of the oxygen radical require some preparation such as the vaporization of the liquid source and the stabilization of the vaporized source gas in the vaporizer 93, and the generation and stabilization of the oxygen radical in the radical generating unit 11, and it takes time to start both of the supplies. Therefore, during the processes, the supply of the source gas/oxygen radical is kept constantly without stopping, and when it is not used the source gas/oxygen radical is exhausted through the bypass pipes 14. This enables the immediate supply of the source gas/oxygen radical to the reaction chamber only by opening/closing the valves 21 to 24 in use, thereby improving the throughput.

Furthermore, while the substrate processing apparatus operates, it is preferable to supply the inert gas ($N_2$, Ar, He, or the like) into the reaction chamber 1 constantly. Specifically, the inert gas is supplied into the reaction chamber 1 from the inert gas supply unit 10 constantly by opening the valve 20 before transferring the substrate. The inert gas is caused to flow constantly not only when transferring the substrate, when raising the temperature of the substrate and when heating after raising the temperature of the substrate, but also when supplying the source gas and when supplying the oxygen radical. This allows the inside of the reaction chamber to be in a purge condition with the inert gas constantly, so that it is possible to prevent adhesion of the particles and the metal contaminants to the substrate, back diffusion to the reaction chamber of the source gas which adheres to the exhaust port 7a and the exhaust pipe 7, and back diffusion to the reaction chamber of oil from a not-shown vacuum pump.

Additionally, in this embodiment, the inert gas is kept flowing during the supply of the source gas and the supply of the oxygen radical as described above. This enables stirring of the source gas and the oxygen radical in the reaction chamber 1. Furthermore, since the inert gas is kept flowing constantly, it is possible for the reaction chamber to be in a condition that the inert gas is supplied to the substrate 4 by itself, that is, the $N_2$ purge condition, when the supply of the source gas and the oxygen radical to the reaction chamber 1 is stopped. Therefore, there also arises a benefit that the interval gas supply process described above can be easily performed.

Further, the following is the reason why the reactant including the oxygen atom is used in the first thin film layer forming step and the supply of the source (step 202) and the supply of the reactant (step 203) are performed in this order.

Specifically, the reactant including the oxygen atom (here, the oxygen radical which is generated by activating the oxygen gas with plasma) also functions as an oxidant, and assuming that the processes are performed in the order of oxidant adhesion→source supply, the oxidant directly adheres to the foundation substrate to promote the oxidization reaction gradually on the substrate surface. This results in a problem that a layer having a low dielectric constant such as $SiO_2$ tends to be formed as an interface layer. Incidentally, as the substrate temperature is higher, the oxidation reaction tends to be increased.

Hence, as in the present invention, by performing the RPO process (step 203) after Hf-(MMP)$_4$ adheres onto the substrate (step 202), the substrate surface is covered with Hf-(MMP)$_4$ when the oxygen radical and the Ar radical are supplied onto the substrate surface in this RPO process to decompose Hf-(MMP)$_4$ for oxidization. Therefore, direct oxidization reaction to the substrate (for example, Si) is not easily caused. In addition, even when Hf-(MMP)$_4$ adheres while the temperature is raised, namely when the substrate temperature is 300° C. or lower, the oxidization reaction on the substrate surface does not easily progress. This is because an oxidant (oxygen species) necessary for oxidizing the substrate does not exist when Hf-(MMP)$_4$ is made to adhere. In addition, the interface layer tends to become an Hf silicate having a slightly higher dielectric constant than that of $SiO_2$. Therefore, according to the present invention, such an effect is obtained that EOT (effective oxide thickness) of the low dielectric constant film can be made small compared with the case when the processes are performed in the order of oxidant adhesion→source supply as described above.

Incidentally, the mechanism of self-decomposition, semi-self-decomposition, and film forming by adhesion of the film-forming source in the first thin film layer forming step and the second thin film layer forming step in the process of this embodiment is as follows. When the substrate temperature is lower than a predetermined critical temperature, the adhesion reaction of the film-forming source mainly occurs, and when the substrate temperature is higher than this temperature, the self-decomposition reaction of the film-forming source mainly occurs. When Hf-(MMP)$_4$ is used as the film-forming source as in this embodiment, it is considered that the critical temperature is near 300° C. In other words, when the film-forming source is supplied to the substrate 4 whose temperature has not reached 300° C. in the step 202 in the first thin film layer forming step A which is performed while the substrate temperature is raised, the adhesion reaction of this film-forming source mainly occurs, and when, in the second thin film layer forming step B which is performed after the substrate temperature is raised up to 390° C. to 440° C., the film-forming source is supplied onto the substrate 4 in the step 205, the self-decomposition reaction of the film-forming source mainly occurs.

A reaction formula of the oxidization after the adhesion of Hf(MMP)$_4$ is as follows:

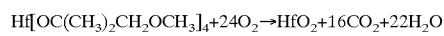

A reaction formula of the self-decomposition reaction of Hf-(MMP)$_4$ is as follows:

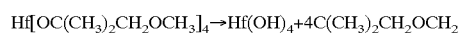

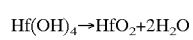

However, in any temperature range, the adhesion reaction of the film-forming source is not completely eliminated, and the self-decomposition reaction and the adhesion reaction of the film-forming source occur concurrently (semi-self-decomposition reaction) in all the CVD reactions. In other words, in the second thin film layer forming step of this embodiment, although the self-decomposition reaction of the film-forming source mainly occurs, the self-decomposition reaction and the adhesion reaction also occur concurrently. The inventors have obtained the experiment result that an amount of the impurities can be made smaller when the self-decomposition reaction is mainly caused.

Second Embodiment

Figure 3:
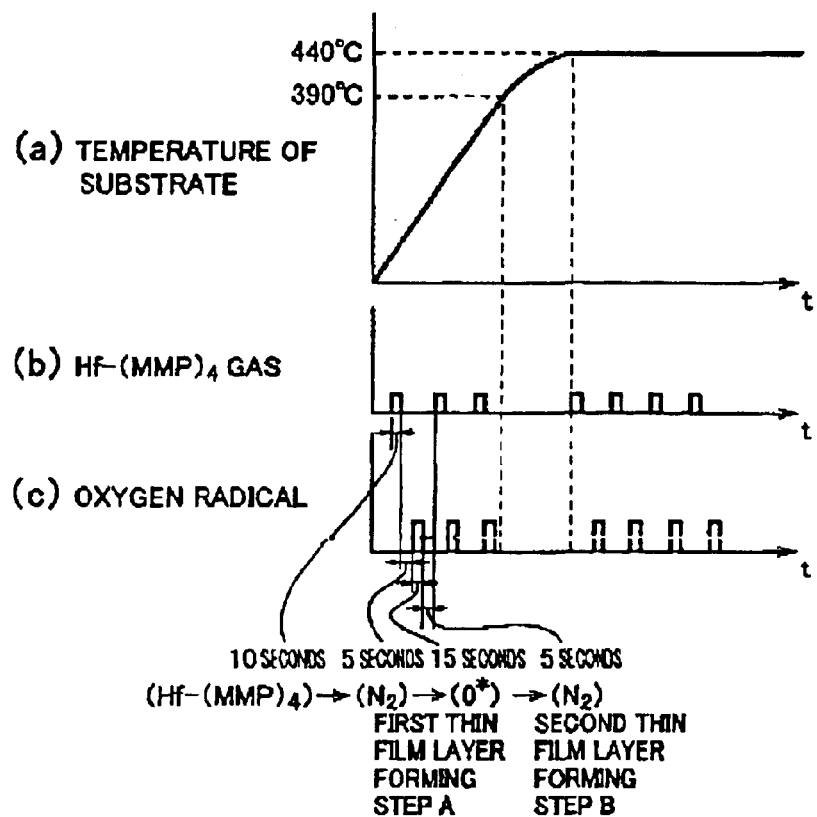
FIG. 3(a) to FIG. 3(c) are views showing relation between temperature of a substrate and a gas cycle according to the first embodiment.

Incidentally, though the first thin film layer is formed while the temperature is raised in the above-described process timing according to the first embodiment in FIG. 3, the first thin film layer may be formed not while the temperature is raised but while a predetermined low temperature (at least 200° C. no more than 390° C.) is kept. FIG.

Figure 4:
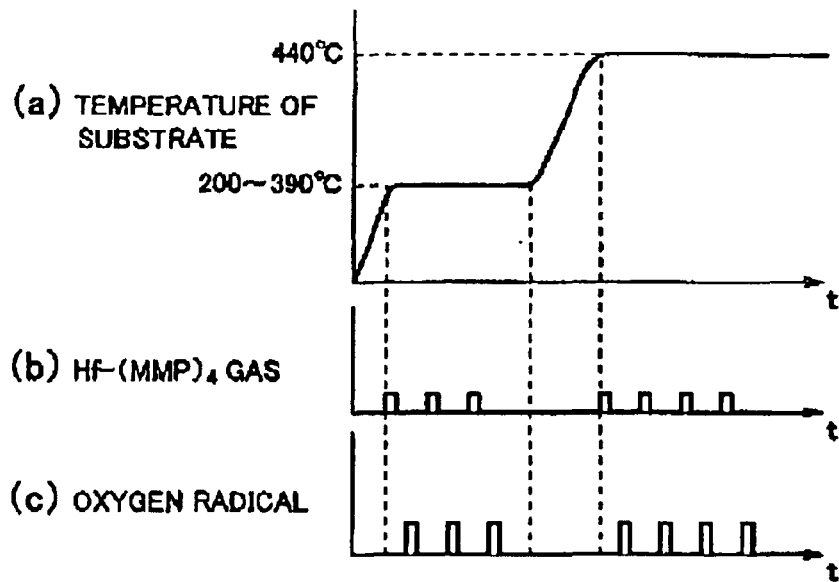
FIG. 4(a) to FIG. 4(c) are views showing relation between temperature of a substrate and a gas cycle according to a second embodiment.

4(a) to FIG. 4(c) show a timing chart of the process of the second embodiment in which the first thin film layer forming step [the supply of the source gas→the supply of the oxygen radical] is repeated for n cycles in a condition that such a low temperature is kept. FIG. 4(a) shows a property of raising temperature of the substrate, in which a horizontal axis indicates time and a vertical axis indicates temperature. FIG. 4(b) shows a timing of supplying the Hf-(MMP)$_4$ source gas and FIG. 4(c) shows a timing of supplying the oxygen radical respectively, in which a horizontal axis indicates time and a vertical axis indicates a supply amount (at any unit).

In the second embodiment, a process with two steps of set temperature is adopted, in which the substrate is not raised up to 440° C. which is the film-forming temperature at a time stroke but the temperature increase is once stopped halfway in the temperature raising process, the temperature at this time is kept and thereafter, the temperature is raised to the film-forming temperature. The first set temperature is to be the first thin film layer forming temperature 200 to 390° C. and the second set temperature is to be the film-forming temperature 440° C. In the condition that the first set temperature is kept, a cycle in which after flowing the Hf-(MMP)$_4$ gas for 10 seconds, the inert gas N$_2$ is caused to flow for 5 seconds as the interval gas supply step, then the oxygen radical O$_2$ as the reactant is caused to flow for 15 seconds, and thereafter, the inert gas N$_2$ is caused to flow for 5 seconds as the interval gas supply step is repeated n times. Thereafter, when the temperature of the substrate reaches 440° C. which is the film-forming temperature by raising the temperature of the substrate again, the second thin film layer forming step [the supply of the source gas→the supply of the oxygen radical] is repeated for m cycles. Incidentally, it is preferable to perform the interval gas supply step between the supply of the source gas and the supply of the oxygen radical as the reactant also in the second thin film layer forming step as well as in the first thin film layer forming step. Since the inert gas N$_2$ is kept flowing through the all steps, when stopping both of the supply of the source gas and the supply of the oxygen radical into the reaction chamber, only N$_2$ of the inert gas is caused to flow in the reaction chamber by itself, whereby it becomes the interval gas supply step by itself.

In this second embodiment, productivity is inferior to the first embodiment by the first step, but if the total time of time required for raising the temperature up to the first thin film layer forming temperature (200 to 390° C.), time required for forming the first thin film layer and time required for raising temperature to the second thin film layer forming temperature (440° C.) is made be close to time required for raising the temperature of the substrate in the conventional process by increasing the rate of raising temperature, it is possible to improve flatness of the CVD thin film without lowering productivity so much.

Further, in the embodiment, the first thin film layer is formed while the substrate temperature is lower than the temperature of film forming by the thermal CVD method, so that the coupling between the substrate 4 and the film sometimes gets weak to lower adhesiveness. In such a case, it is recommendable that a hydrogen supply unit which supplies a hydrogen (H$_2$) gas via the gas supply pipe 40 is provided on the upstream side of the radical generating unit 11, the hydrogen (H$_2$) gas is activated with plasma by the radical generating unit 11 immediately after the substrate is mounted, and a generated hydrogen radical is supplied onto the substrate 4 (RPH (Remote Plasma Hydrogenation) process). The hydrogen radical cleans the surface to eliminate contaminating substance, and in addition, the state in which the substrate surface is terminated with hydrogen is produced to enhance adhesiveness to a film to be subsequently deposited. Therefore, when the film-forming source supply (step 202) and the RPO process (step 203) are performed after the surface treatment of the substrate is performed by the supply of the hydrogen radical to the substrate after the substrate is mounted, the coupling between the film and the substrate 4 gets strong so that adhesiveness can be enhanced. It is reasoned that the adhesiveness is enhanced because the use of hydrogen at the time when the film and the substrate 4 are coupled on an atomic level easily causes the coupling therebetween even in a state with a relatively small energy, namely, in a state with a low substrate temperature.

Third Embodiment

Figure 11:
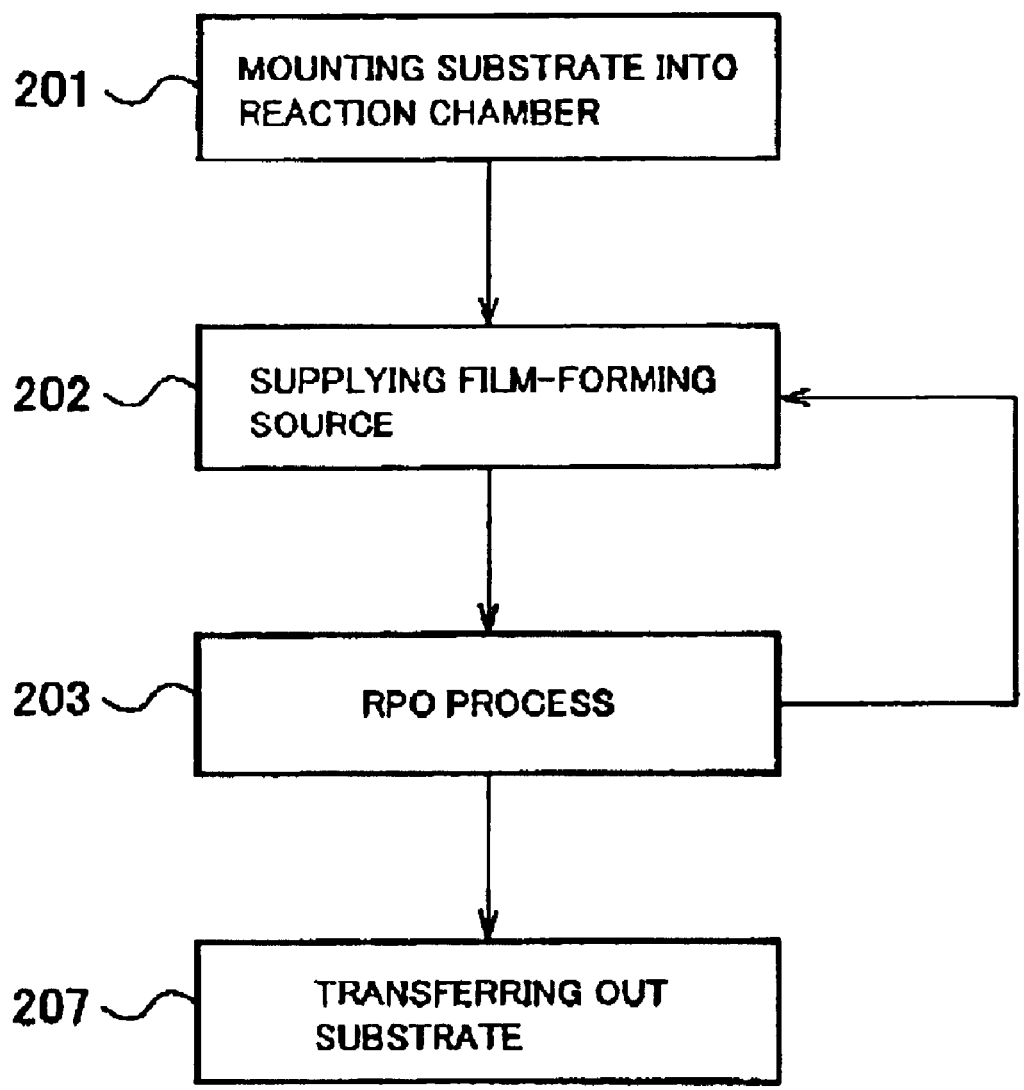
FIG. 11 is a process flow chart according to a third embodiment.

FIG. 11 shows a process flow according to a third embodiment. As shown in this drawing, in this embodiment, a film is formed in such a manner that a step of making a source gas adhere onto a substrate (step 202) and a step of forming a film (HfO$_2$ film) by supplying onto the substrate a reactant which is obtained by plasma activation of a gas containing an oxygen atom (step 203) are repeated a plurality of times in this order during a period from the transfer of the substrate into a reaction chamber (step 201) to the transfer of the substrate out of the reaction chamber (step 207). In other words, the second thin film layer forming step is not performed in this embodiment, and n cycles of [the film-forming source supply (step 202)→the RPO process (step 203)] are repeated from the beginning to the end, thereby forming the film. Here, the film-forming source supply (step 202) and the RPO process (step 203) are performed in this order so that such an effect is obtainable that EOT (effective oxide thickness) of a low dielectric constant film can be made small as described above.

In this case, purge with an inert gas (non-reactive gas) is preferably performed between the film-forming source supply (step 202) and the RPO process (step 203). Moreover, purge with an inert gas is preferably performed also between the RPO process (step 203) and the film-forming source supply (step 202) in a subsequent cycle. This makes an amount of the source gas adhering onto the substrate even, and in addition, can prevent the source gas and the reactant from existing in an atmosphere in the reaction chamber concurrently so that particle occurrence can be prevented.

As an example, an HfO$_2$ film was formed under such a condition that the substrate temperature was set to 250° C. to 300° C., the pressure inside the reaction chamber was set to 50 Pa to 300 Pa, the flow amount of Hf-(MMP)$_4$ was set to 0.01 g/min to 0.2 g/min, and 80 cycles of [the film-forming source supply (step 202)→the inert gas purge→the RPO process (step 203)→the inert gas purge], which was defined as one cycle, were repeated. Here, the time for one cycle was set to 40 seconds. 40 seconds are broken down into 10 seconds for the source supply time to the substrate (step 202), 5 seconds for the inert gas purge time, 20 seconds for the RPO process time (step 203), and 5 seconds for the inert gas purge time.

As a result, the thickness of the HfO$_2$ film formed per cycle was about 0.6 Å/cycle, and when this one cycle was repeated 80 times, the total film thickness amounted to about 5 nm. An interface layer (low dielectric constant layer) of the HfO$_2$ film formed through this process was in an Hf silicate state, and the thickness thereof is estimated to be about 0.6 nm. This estimated value can be easily estimated from an electrical property.

Also in this case, the $HfO_2$ film is formed while the temperature of the substrate is lower than the temperature of film forming by a thermal CVD method, so that coupling between the substrate 4 and the $HfO_2$ film sometimes gets weak to lower adhesiveness. Therefore, also in this case, an RPH process is preferably performed before each cycle of [the film-forming source supply (step 202)→the inert gas purge→the RPO process (step 203)→the inert gas purge].

Incidentally, in each of the above-described embodiments, the oxygen $O_2$ is used to generate the oxygen radical, it is possible to use an oxygen containing gas such as $N_2O$, NO, $O_3$ or the like other than $O_2$. As for $N_2O$ and NO, similarly to $O_2$, they are activated by the radical generating unit 11 to generate the oxygen radical and are supplied to the reaction chamber 1. However, as for $N_2O$ and $O_3$, they may be supplied to the reaction chamber 1 as they are without being activated. This is because the oxygen radical is substantially supplied to the substrate since the oxygen radical is generated in the reaction chamber 1 by heat after the supply though they are supplied without being activated. Therefore, as for the case that the oxygen radical is supplied onto the substrate in the present invention, the case that $N_2O$ and $O_3$ are supplied as they are without being activated is also included.

In each of the embodiments described above, the formation of the amorphous $HfO_2$ film in is explained, but the present invention is also widely applicable to the formation of a film including Hf such as an amorphous Hf silicate film. Furthermore, the present invention is also applicable to the formation of other metal oxide films such as a $Ta_2O_5$ film and a $ZrO_2$ film, not limited to the film including Hf such as the $HfO_2$ film. The films in the following (1) to (8) are examples of films, among the films other than the film including Hf, which can be formed by applying the present invention.

(1) a TaO film utilizing $PET(Ta(OC_2H_5)_5)$ (tantalum oxide film)

(2) a ZrO film utilizing $Zr-(MMP)_4$ (zirconium oxide film)

(3) an AlO film utilizing $Al-(MMP)_3$ (aluminum oxide film)

(4) a ZrSiO film and a ZrSiON film utilizing $Zr-(MMP)_4$ and $Si-(MMP)_4$ (Zr oxide silicate film) (Zr oxynitride silicate film)

(5) a ZrAlO film and a ZrAlON film utilizing $Zr-(MMP)_4$ and $Al-(MMP)_3$ (6) a TiO film utilizing $Ti-(MMP)_4$ (titanium oxide film)

(7) a TiSiO film and a TiSiON film utilizing $Ti-(MMP)_4$ and $Si-(MMP)_4$ (8) a TiAlO film and a TiAlON film utilizing $Ti-(MMP)_4$ and $Al-(MMP)_3$ As for the foundation of the formed film, it is not limited to the silicon substrate but may include one on which a $SiO_2$ film is thinly applied on the surface of the silicon substrate, one on which a $Si_3N_4$ film is thinly applied on the surface of the silicon substrate, and the like.

According to the present invention, it is possible to improve flatness of a thin film without generating particles. Moreover, according to the present invention, it is possible to improve flatness of a thin film without lowering the productivity.

What is claimed is:

1. A manufacturing method of a semiconductor device, comprising:

a first thin film layer forming step of, after making a source gas adhere onto a substrate while a temperature of the substrate is lower than a temperature of film forming by a thermal CVD method, supplying a reactant different from the source gas onto the substrate to thereby form a first thin film layer; and a second thin film layer forming step of, after raising the temperature of the substrate up to the temperature of film forming by the thermal CVD method, forming a second thin film layer on the first thin film layer by the thermal CVD method using the source gas, wherein said first thin film layer forming step and said second thin film layer forming step are performed in one reaction chamber, and wherein said first thin film layer forming step is performed in the middle of the substrate temperature increase in which the temperature of the substrate is raised up to the temperature of film forming by the thermal CVD method before the supply of the source gas for forming the second thin film layer.

2. A manufacturing method of a semiconductor device according to claim 1, wherein the supply of the source gas and the supply of the reactant onto the substrate are repeated a plurality of times in said first thin film layer forming step.

3. A manufacturing method of a semiconductor device according to claim 1, wherein a non-reactive gas is supplied between the supply of the source gas and the supply of the reactant onto the substrate in said first thin film layer forming step.

4. A manufacturing method of a semiconductor device according to claim 1, wherein the temperature of the substrate in said first thin film layer forming step is in a range of no lower than 200° C. and no higher than 390° C.

5. A manufacturing method of a semiconductor device according to claim 1, wherein said source gas is an organic source gas.

6. A manufacturing method of a semiconductor device according to claim 1, wherein said source gas is a gas obtained by vaporizing a source including Hf, and the thin film to be formed is a film including Hf.

7. A manufacturing method of a semiconductor device according to claim 1, wherein said source gas is a gas obtained by vaporizing $Hf[OC(CH_3)_2CH_2OCH_3]_4$, and the thin film to be formed is a film including Hf.

8. A manufacturing method of a semiconductor device according to claim 1, wherein said reactant includes an oxygen atom.

9. A manufacturing method of a semiconductor device according to claim 1, wherein said reactant includes a gas obtained by activating a gas including an oxygen atom with plasma.

10. A manufacturing method of a semiconductor device according to claim 1, wherein said source gas and reactant are supplied from one supply port.

11. A manufacturing method of a semiconductor device according to claim 1, wherein said source gas and reactant are supplied from different supply ports respectively, and when the source gas is supplied to the substrate from a source gas supply port, a non-reactive gas is supplied to a reactant supply port while, when the reactant is supplied to the substrate from the reactant supply port, the non-reactive gas is supplied to the source gas supply port.

12. A manufacturing method of a semiconductor device according to claim 1, wherein the reactant is exhausted so as to bypass the reaction chamber without stopping when the source gas is supplied to the substrate, while the source gas is exhausted so as to bypass the reaction chamber without stopping when the reactant is supplied to the substrate.

13. A manufacturing method of a semiconductor device according to claim 1, wherein a step of forming a thin film by the thermal CVD method and a step of supplying the reactant to the formed thin film are repeated a plurality of times in the second thin film layer forming step.

14. A manufacturing method of a semiconductor device according to claim 1, wherein said first thin film layer forming step or/and said second thin film, layer forming step is(are) carried out while the substrate is rotated.

15. A manufacturing method of a semiconductor device according to claim 1, further comprising:

a step of supplying a hydrogen radical onto the substrate before the first thin film layer forming step.

16. A manufacturing method of a semiconductor device, comprising:

a first thin film layer forming step of, after making a source gas adhere onto a substrate while a temperature of the substrate is lower than a temperature of film forming by a thermal CVD method, supplying a reactant different from the source gas onto the substrate to thereby form a first thin film layer; and a second thin film layer forming step of forming a second thin film layer on the first thin film layer using the source gas after the temperature of the substrate is raised up to the temperature of film forming by the thermal CVD method, wherein a step of forming a thin film by the thermal CVD method and a step of supplying a reactant to the formed thin film are repeated a plurality of times in said second thin film layer forming step.

17. A manufacturing method of a semiconductor device according to claim 16, wherein the supply of the source gas and the supply of the reactant onto the substrate are repeated a plurality of times in said first thin film layer forming step.

18. A manufacturing method of a semiconductor device, comprising:

a first thin film layer forming step of, after making a source gas adhere onto a substrate while a temperature of the substrate is lower than a temperature of film forming by a thermal CVD method, supplying onto the substrate a reactant which is obtained by activating a gas including an oxygen atom with plasma, to thereby form a first thin film layer; and a second thin film layer forming step of forming a second thin film layer on the first thin film layer by the thermal CVD method using the source gas after the temperature of the substrate is raised up to the temperature of film forming by the thermal CVD method.

19. A manufacturing method of a semiconductor device, comprising:

a step of making a source gas adhere onto a substrate; and a step of supplying onto the substrate a reactant which is obtained by activating a gas including an oxygen atom with plasma, to thereby form a film wherein said step of the adhesion of the source gas and said step of the supply of the reactant are repeated in this order a plurality of times.

20. A substrate processing apparatus, comprising:

a processing chamber which processes a substrate;

a heater which heats the substrate in the processing chamber;

a source gas supply system which supplies a source gas;

a reactant supply system which supplies a reactant different from the source gas;

an exhaust port which exhausts the processing chamber; and a controller which carries out an control operation in such a manner that the reactant is supplied onto the substrate after the source gas is supplied to adhere onto the substrate while a temperature of the substrate is raised up to a temperature of film forming by a thermal CVD method, and thereafter, the source gas is supplied onto the substrate after the temperature of the substrate is raised up to the temperature of film forming by the thermal CVD method.

* * * * *